(12) United States Patent
Kimura et al.

(10) Patent No.: US 8,536,862 B2
(45) Date of Patent: Sep. 17, 2013

(54) APPARATUS AND METHOD OF OBTAINING FIELD BY MEASUREMENT

(75) Inventors: Kenjiro Kimura, Kyoto (JP); Kei Kobayashi, Kyoto (JP); Hirofumi Yamada, Kyoto (JP); Kazumi Matsushige, Kyoto (JP); Takashi Horiuchi, Kyoto (JP); Nobuo Satoh, Kyoto (JP); Akifumi Nakai, Kyoto (JP)

(73) Assignee: Kyoto University, Kyoto (JP)

( * ) Notice: Subject to any disclaimer, the term of this patent is extended or adjusted under 35 U.S.C. 154(b) by 773 days.

(21) Appl. No.: 12/594,050

(22) PCT Filed: Mar. 28, 2008

(86) PCT No.: PCT/JP2008/056137
§ 371 (c)(1),
(2), (4) Date: May 14, 2010

(87) PCT Pub. No.: WO2008/123432
PCT Pub. Date: Oct. 16, 2008

(65) Prior Publication Data
US 2010/0219819 A1    Sep. 2, 2010

(30) Foreign Application Priority Data
Mar. 30, 2007 (JP) ................... P2007-91856

(51) Int. Cl.
*G01R 33/02* (2006.01)
(52) U.S. Cl.
USPC ........................................... 324/244
(58) Field of Classification Search
USPC ...... 324/244, 244.1, 260, 261, 262; 250/306, 250/307; 850/25, 46
See application file for complete search history.

(56) References Cited

U.S. PATENT DOCUMENTS 5,465,046 A    11/1995 Campbell et al.
6,714,008 B1 *    3/2004 Holmes et al. ................ 324/261

FOREIGN PATENT DOCUMENTS

| JP | 9-160903 | 6/1997 |
| JP | 09-229727 | 9/1997 |
| JP | 2000-039414 | 2/2000 |
| JP | 2000-275206 | 10/2000 |
| JP | 2002-257705 | 9/2002 |

(Continued)

OTHER PUBLICATIONS

G. Arfken, Mathematical Methods for Physicists, 3rd ed., Academic Press, Inc., 1985, chapter 2, p. 85.*

(Continued)

*Primary Examiner* — Melissa J Koval
*Assistant Examiner* — Daniel Miller
(74) *Attorney, Agent, or Firm* — Wenderoth, Lind & Ponack, L.L.P.

(57) ABSTRACT

Above a sample (9) having magnetic domains, a distribution of magnetic force in a measurement plane (91) is obtained as a magnetic force image using a MFM, an auxiliary magnetic force image is obtained by performing measurement in a measurement plane (92) away from the measurement plane (91) by a distance d, and a difference between them is divided by the distance d to obtain a magnetic force gradient image. The magnetic force image and the auxiliary magnetic force image are Fourier transformed and substituted into a three-dimensional field obtaining equation derived from a general solution of the Laplace equation, and the three-dimensional field indicating the magnetic force is obtained. A state of the magnetic domains at the surface (93) of the sample (9) can be obtained with high accuracy by obtaining the three-dimensional field.

18 Claims, 12 Drawing Sheets

(56) References Cited

FOREIGN PATENT DOCUMENTS

| | | |
|---|---|---|
| JP | 2002-366537 | 12/2002 |
| JP | 2006-031413 | 2/2006 |
| WO | 2005/050186 | 6/2005 |

OTHER PUBLICATIONS

G. Ioannidis, Identification of a Ship or Submarine from its Magnetic Signature, IEEE Transactions on Aerospace and Electronic Systems, vol. AES-13, No. 3, pp. 327-329, 1977.*

Patent Cooperation Treaty (PCT) International Preliminary Report on Patentability issued Oct. 13, 2009 in International Application No. PCT/JP2008/056137.

International Search Report issued Jul. 8, 2008 in International (PCT) Application No. PCT/JP2008/56137.

Bradley J. Roth, et al., "*Using a magnetometer to image a two-dimensional current distribution*", J. Appl. Phys., 1989, 01, vol. 65, No. 1, pp. 361-372.

Extended European Search Report (in English language) issued Feb. 17, 2011 in corresponding European Patent Application No. 08 73 9255.

Hans J. Hug, et al. "*Quantitative magnetic force microscopy on perpendicularly magnetized samples*", Journal of Applied Physics, vol. 83, No. 11, Jun. 1, 1998, p. 5609-5620, XP012043894.

S.J. L. Vellekoop et al., "*Calculation of playback signals from MFM images using transfer functions*", Journal of Magnetism and Magnetic Materials, vol. 193, No. 1-3, Mar. 1999, pp. 474-478, XP002619719.

Ricardo Ferre et al., "*Large scale micromagnetic calculations for finite and infinite 3D ferromagnetic systems using FFT*", Computer Physics Communications, vol. 105, No. 2-3, Oct. 1, 1997, pp. 169-186, XP022266184.

\* cited by examiner

APPARATUS AND METHOD OF OBTAINING FIELD BY MEASUREMENT

TECHNICAL FIELD

The present invention relates to a technique of obtaining a three-dimensional field of magnetic, electric, temperature and gravity potential and the like, a high-dimensional field extended by including time and the like, and a two-dimensional field by measurement.

BACKGROUND ART

Development of an apparatus which evaluates structure of magnetic domains on a magnetic material, is performed in parallel with density growth in magnetic recording to the magnetic material which is a recording medium. The scanning tunneling microscopy and the scanning electron microscopy using spin-polarized electrons are expected to have a resolution equal to or less than 5 nm. However, these apparatuses can only perform observation of the surface of magnetic material which is extremely clean, and it is not easy to apply them as practicable evaluation apparatuses or inspection apparatuses provided in a manufacturing line. Consequently, it is suggested to use the magnetic force microscopy (hereinafter referred to as "MFM") which can observe the magnetic domain structure on an insulating protective film, as an evaluation apparatus for the magnetic domain structure. In the MFM, detected is a force which affects a probe of a cantilever having a magnetic material or a current path and which is caused by a leak magnetic field from a sample. However, when the measurement distance between the surface of the sample and the probe is too small, since affection of the van der Waals force between the surface of the sample and the probe becomes large and quantitative observation of the magnetic domain structure becomes difficult, it is absolutely necessary in the quantitative observation to separate the probe from the surface of the sample by a distance larger than or equal to a predetermined distance. As the result, spatial resolution stays lower than or equal to 10 nm in the present situation.

On the other hand, in "Using a magnetometer to image a two-dimensional current distribution", by Bradley J. Roth et al., Journal of Applied Physics, United States, American Institute of Physics, Jan. 1, 1989, Vol. 65, No. 1, p. 361-372 (Document 1), proposed is the technique that the relationship between electric current and a magnetic field is mathematized with use of the Biot-Savart law in the experiment where flux change is measured by using the superconducting quantum interference device, and a current density distribution is calculated from the magnetic field measured at the position above the surface of the sample. In addition, a possibility of obtaining information of magnetized state in positions including a surface of thin film and a cross section of the thin film by the MFM, is mentioned in Japanese Patent Application Laid-Open No. 2002-257705 (Document 2), and Japanese Patent Application Laid-Open No. 2002-366537 (Document 3) discloses a method of alternately and iteratively performing a amendment which satisfies the Dirichlet condition and a amendment which satisfies the Neumann condition, on an approximate solution of the Laplace equation when a potential problem satisfying the Laplace equation and having a mixing boundary value at a boundary is solved.

In the meantime, the technique proposed in the Document 1 premises that the current density distribution exists only on the surface of the sample, and the technique can not be used as a common tool to analyze a magnetic field.

DISCLOSURE OF INVENTION

It is a main object of the present invention to offer the technique of obtaining a various three-dimensional field of magnetic potential, electric potential or the rest satisfying the Laplace equation, with high accuracy from values measured at a position away from an object, i.e., the position is in a non-contacting area, and further generally, the present invention is applied to an n-dimensional field having at least two dimensions.

The present invention is intended for a three-dimensional field obtaining apparatus for obtaining $\phi(x, y, z)$ (where x, y, z show coordinate parameters (variables) in a rectangular coordinate system defined by X, Y, Z directions which are orthogonal to one another) or obtaining a function derived by differentiating $\phi(x, y, z)$ with respect to z one time or more, $\phi(x, y, z)$ being a field function showing a three-dimensional scalar field which is formed at least at circumference or inside of an object due to existence of the object and satisfies the Laplace equation. The apparatus comprises: a measured value group obtaining part for obtaining a distribution of measured values of one type in a measurement plane as a two-dimensional first measured value group and obtaining a distribution of measured values of another type in the measurement plane as a two-dimensional second measured value group, the measurement plane being set at outside or inside of an object (the outside or the inside includes a surface of the object and it is nothing but represented for confirmation) and satisfying z=0, the distribution of measured values of one type coming from the three-dimensional scalar field, the distribution of measured values of another type coming from the three-dimensional scalar field; and an operation part for calculating $\phi_z^{(q)}(x, y, 0)$ and $\phi_z^{(p)}(x, y, 0)$ which are q times differential and p times differential of $\phi(x, y, z)$ in the measurement plane with respect to z (where p, q are integers which are equal to or larger than 0, and one of them is odd and the other is even), on the basis of the first measured value group and the second measured value group, and calculating $\phi_z^{(q)}(k_x, k_y)$ and $\phi_z^{(p)}(k_x, k_y)$ by Fourier transforming $\phi_z^{(q)}(x, y, 0)$ and $\phi_z^{(p)}(x, y, 0)$, respectively (where $k_x$, $k_y$ are wavenumbers in the X direction and the Y direction), and furthermore calculating $\phi_z^{(q)}(x, y, z)$ by deriving a Fourier transformed function of $\phi_z^{(q)}(x, y, z)$ from $\phi_z^{(q)}(k_x, k_y)$ and $\phi_z^{(p)}(k_x, k_y)$. The measured value groups, for example, are obtained as two-dimensional images.

Preferably, the operation part calculates $\phi_z^{(q)}(x, y, z)$ by using Eq. 1. However, there is no need to strictly apply Eq. 1 in calculation, the calculation according to an equation similar or approximate to Eq. 1, or the calculation according to an equation transformed from Eq. 1 may be properly employed. The well-known various skillful techniques may be employed with regards to the Fourier transform and the inverse Fourier transform.

$$\phi_z^{(q)}(x, y, z) = \int\int \exp(ik_x x + ik_y y)\sqrt{k_x^2 + k_y^2}^q \qquad \text{(Eq. 1)}$$

-continued $$\left\{\begin{array}{l}\left[\dfrac{\phi_z^{(q)}(k_x,k_y)\sqrt{k_x^2+k_y^2}^{-q}(-1)^p-}{\phi_z^{(p)}(k_x,k_y)\sqrt{k_x^2+k_y^2}^{-p}(-1)^q}\right]\exp\left(z\sqrt{k_x^2+k_y^2}\right)+\\ \left[\dfrac{\phi_z^{(q)}(k_x,k_y)\sqrt{k_x^2+k_y^2}^{-q}-}{\phi_z^{(p)}(k_x,k_y)\sqrt{k_x^2+k_y^2}^{-p}}\right]\exp\left(-z\sqrt{k_x^2+k_y^2}\right)\end{array}\right\}$$

$$dk_x dk_y$$

It is possible to calculate $\phi_z^{(q)}(x, y, z)$, which is a function of the three-dimensional field in the broad sense of the term, from the first measured value group and the second measured value group by performing the calculation of Eq. 1 (the calculation contains a calculation pursuant to Eq. 1 and the same applies hereinafter), and the three-dimensional field can be reproduced accurately.

Preferably, p is (q+1), the first measured value group shows $\phi_z^{(q)}(x, y, 0)$, and the measured value group obtaining part comprises: a measuring part for obtaining the distribution of measured values of one type as a two-dimensional measured value group, the distribution of measured values of one type coming from the three-dimensional scalar field; and a differential measured value group generating part for calculating a difference measured value group between the first measured value group obtained in the measurement plane by the measuring part and an intermediate measured value group obtained by the measuring part in a plane away from the measurement plane by a minute distance with respect to the Z direction, to obtain a differential measured value group as the second measured value group, the differential measured value group being derived by dividing the difference measured value group by the minute distance.

It is possible to apply a field of magnetic, electric, temperature, photoelectric, stress or gravity potential, as the three-dimensional scalar field, preferably.

The present invention can be applied to a magnetic force microscopy, an information reading apparatus for reading information recorded on a surface of an object, a current distribution measuring apparatus for an electric circuit of inside of an object, a biomagnetic field measuring apparatus for measuring a magnetic field of inside of a living body and a nondestructive inspection apparatus for inspecting inside of a structure, each using the above three-dimensional field obtaining apparatus. Furthermore, the present invention is intended for a three-dimensional field obtaining method, and a program and a recording medium for causing a computer to execute this three-dimensional field obtaining method.

The technique of obtaining a three-dimensional field by measurement can be extended to a various technique of obtaining an n-dimensional field having high-dimension, for example, the technique can be easily used for a technique of obtaining a four-dimensional field to which time is added as one parameter. The technique can be used for a field having less than or equal to two-dimension. The generalized technique of obtaining an n-dimensional field can be used for obtaining a various field of magnetic, electric, temperature or gravity potential, elastic wave, photoelectric field or the rest. The technique can be applied to not only the above potential field, but also a function which expresses a physical or engineering phenomenon represented with n parameters more than or equal to two and which satisfies the Laplace equation.

These and other objects, features, aspects and advantages of the present invention will become more apparent from the following detailed description of the present invention when taken in conjunction with the accompanying drawings.

BEST MODE FOR CARRYING OUT THE INVENTION

Figure 1:
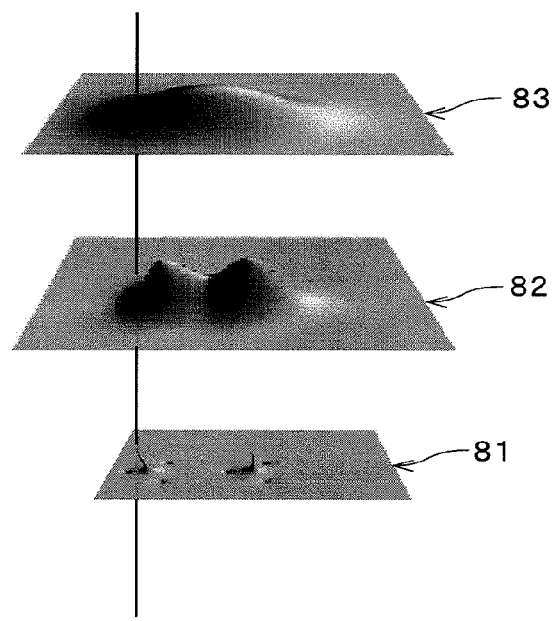
FIG. 1 is a view showing a model of a Laplace field.

First, discussion will be made on the principle of a three-dimensional field obtaining method in accordance with the present invention. Various three-dimensional scalar fields, for example, like a field of magnetic potential which a magnetized magnetic material forms at circumference thereof, a field of electric potential which a electric charge on an insulating material forms, a field of magnetic potential which the current flowing through inside of a multilayer semiconductor device forms at circumference or inside of the semiconductor device, and the rest, are formed at circumferences or insides of objects due to existence of the objects. These fields satisfy the Laplace equation, what the three-dimensional field obtaining method in accordance with the present invention obtains is the three-dimensional scalar field itself satisfying the Laplace equation or a function derived by differentiating the three-dimensional scalar field with respect to a predetermined direction one time or more, and a concept of the three-dimensional field obtained by the three-dimensional field obtaining method contains all of them.

When a field function which shows a field satisfying the Laplace equation, is represented by $\phi(x, y, z)$ (where x, y, z show coordinate parameters in a rectangular coordinate system defined by X, Y, Z directions which are orthogonal to one another), $\phi(x, y, z)$ is represented by Eq. 2 with use of Laplacian $\Delta$.

$$\Delta\phi(x,y,z)=0 \qquad (Eq.\ 2)$$

The general solution of this equation can be represented by Eq. 3 as the sum of a term which exponentially decreases with respect to the Z direction in the x, y, z rectangular coordinate system and a term which exponentially increases.

$$\phi(x,y,z)=\iint \exp(ik_x x+ik_y y)\{a(k_x,k_y)\exp(z\sqrt{k_x^2+k_y^2})+b(k_x,k_y)\exp(-z\sqrt{k_x^2+k_y^2})\}dk_x dk_y \qquad (Eq.\ 3)$$

In Eq. 3, $k_x$, $k_y$ are wavenumbers in the X direction and the Y direction, and $a(k_x, k_y)$, $b(k_x, k_y)$ are functions represented by $k_x$, $k_y$. Furthermore, a function derived by differentiating both sides of Eq. 3 once with respect to z, is represented by Eq. 4.

$$\phi_z(x,y,z)=\iint \exp(ik_x x+ik_y y)\sqrt{k_x^2+k_y^2}\{a(k_x,k_y)\exp(z\sqrt{k_x^2+k_y^2})-b(k_x,k_y)\exp(-z\sqrt{k_x^2+k_y^2})\}dk_x dk_y \qquad (Eq.\ 4)$$

Here, $\phi(x, y, z)$ in a plane parallel to the XY plane which satisfies $z=0$, that is $\phi(x, y, 0)$, is represented by Eq. 5.

$$\phi(x,y,0)=\iint \exp(ik_x x+ik_y y)\{a(k_x,k_y)+b(k_x,k_y)\}dk_x dk_y \qquad (Eq.\ 5)$$

In a similar fashion, by substituting $z=0$ into Eq. 4, $\phi_z(x, y, 0)$ is represented by Eq. 6.

$$\phi_z(x,y,0)=\iint \exp(ik_x x+ik_y y)\sqrt{k_x^2+k_y^2}\{a(k_x,k_y)-b(k_x,k_y)\}dk_x dk_y \qquad (Eq.\ 6)$$

Thus, $\phi(k_x, k_y)|_{z=0}$ and $\phi_z(k_x, k_y)|_{z=0}$ (hereinafter, simply represented by $\phi(k_x, k_y)$, $\phi_z(k_x, k_y)$) derived by Fourier transforming $\phi_z(x, y, 0)$ and $\phi_z(x, y, 0)$, respectively, are represented by Eq. 7 and Eq. 8.

$$\phi(k_x,k_y)=a(k_x,k_y)+b(k_x,k_y) \qquad (Eq.\ 7)$$

$$\phi_z(k_x,k_y)=\sqrt{k_x^2+k_y^2}\{a(k_x,k_y)-b(k_x,k_y)\} \qquad (Eq.\ 8)$$

$a(k_x, k_y)$, $b(k_x, k_y)$ can be calculated from Eq. 7 and Eq. 8, and these are represented by Eq. 9 and Eq. 10.

$$a(k_x, k_y) = \frac{1}{2}\left(\phi(k_x, k_y) + \frac{\phi_z(k_x, k_y)}{\sqrt{k_x^2 + k_y^2}}\right) \qquad (Eq.\ 9)$$

$$b(k_x, k_y) = \frac{1}{2}\left(\phi(k_x, k_y) - \frac{\phi_z(k_x, k_y)}{\sqrt{k_x^2 + k_y^2}}\right) \qquad (Eq.\ 10)$$

Here, by substituting $a(k_x, k_y)$ and $b(k_x, k_y)$ of Eq. 9 and Eq. 10 into Eq. 3, $\phi(x, y, z)$ is represented by Eq. 11.

$$\phi(x, y, z) = \iint \exp(ik_x x + ik_y y) \qquad (Eq.\ 11)$$

$$\left\{\begin{array}{l} \frac{1}{2}\left(\phi(k_x, k_y) + \frac{\phi_z(k_x, k_y)}{\sqrt{k_x^2 + k_y^2}}\right)\exp\left(z\sqrt{k_x^2 + k_y^2}\right) + \\ \frac{1}{2}\left(\phi(k_x, k_y) - \frac{\phi_z(k_x, k_y)}{\sqrt{k_x^2 + k_y^2}}\right)\exp\left(-z\sqrt{k_x^2 + k_y^2}\right) \end{array}\right\} dk_x dk_y$$

From the above discussion, when $\phi(x, y, 0)$ which is the Dirichlet boundary condition and $\phi_z(x, y, 0)$ which is the Neumann boundary condition are obtained by measurement in a measurement plane which is set at outside of the object and satisfies $z=0$, a Fourier transformed function of $\phi(x, y, z)$ with respect to x and y is derived as shown in Eq. 11 by Fourier transforming these $\phi(x, y, 0)$ and $\phi_z(x, y, 0)$, and the inverse Fourier transform is performed. It is therefore possible to obtain $\phi(x, y, z)$ and the three-dimensional field is strictly derived. In the case where measurement can be performed at the inside of the object (for example, measurement is performed by inserting a probe into a cell and so on), a measurement plane may be set at the inside of the object.

Furthermore, $a(k_x, k_y)$ and $b(k_x, k_y)$ can be calculated by performing an operation according to the derivation of Eq. 11 on functions derived by differentiating Eq. 3 odd times and even times with respect to z, and an equation which is derived by differentiating $\phi(x, y, z)$ one time or more and corresponds to Eq. 11 can be derived. In other words, when q times differential and p times differential with respect to z of a field function $\phi(x, y, z)$ which shows a field satisfying the Laplace equation, are represented by $\phi_z^{(q)}(x, y, z)$ and $\phi_z^{(p)}(x, y, z)$, and Fourier transformed functions of $\phi_z^{(q)}(x, y, 0)$ and $\phi_z^{(p)}(x, y, 0)$ are represented by $\theta_z^{(q)}(k_x, k_y)$ and $\theta_z^{(p)}(k_x, k_y)$, respectively, where p, q are integers which are equal to or larger than 0, and one of them is odd and the other is even, $\phi_z^{(q)}(x, y, z)$ is represented by Eq. 12.

$$\phi_z^{(q)}(x, y, z) = \iint \exp(ik_x x + ik_y y)\sqrt{k_x^2 + k_y^2}^q \qquad (Eq.\ 12)$$

$$\left\{\begin{array}{l} \left(\frac{\phi_z^{(q)}(k_x, k_y)\sqrt{k_x^2 + k_y^2}^{-q}(-1)^p - \phi_z^{(p)}(k_x, k_y)\sqrt{k_x^2 + k_y^2}^{-p}(-1)^q}{(-1)^p - (-1)^q}\right)\exp\left(z\sqrt{k_x^2 + k_y^2}\right) + \\ \left(\frac{\phi_z^{(q)}(k_x, k_y)\sqrt{k_x^2 + k_y^2}^{-q} - \phi_z^{(p)}(k_x, k_y)\sqrt{k_x^2 + k_y^2}^{-p}}{(-1)^q - (-1)^p}\right)\exp\left(-z\sqrt{k_x^2 + k_y^2}\right) \end{array}\right\}$$

$$dk_x dk_y$$

From the above discussion, when $\phi_z^{(q)}(x, y, 0)$ and $\phi_z^{(p)}(x, y, 0)$ can be obtained by measurement, $\phi^{(q)}(k_x, k_y)$ and $\phi^{(p)}(k_x, k_y)$ are calculated by Fourier transforming them, a Fourier transformed function of $\phi_z^{(q)}(x, y, z)$ is derived from $\phi^{(q)}(k_x, k_y)$ and $\phi^{(p)}(k_x, k_y)$ with use of Eq. 12 and the inverse Fourier transform is performed. It is therefore possible to obtain $\phi_z^{(q)}(x, y, z)$. In other words, $\phi(x, y, z)$ or a function derived by differentiating $\phi(x, y, z)$ with respect to z one time or more, where z is orthogonal to the measurement plane, can be calculated strictly. In the three-dimensional field obtaining method in accordance with the present invention, the three-dimensional field (which contains a three-dimensional field in the broad sense) coming from the field which satisfies the Laplace equation is obtained from the measurement result in the measurement plane, on the basis of the above principle. Any field can be targeted as the field satisfying the Laplace equation, a field of magnetic, electric, temperature, gravity potential and the rest can be quoted, and the three-dimensional fields coming from these fields can be calculated strictly by the present invention.

FIG. 1 is a view showing a model, which is computed by a computer, of an example of a field satisfying the Laplace equation, and in the case where two trivalent positive ions and monovalent negative ions existing at three-fold symmetry positions of respective positive ions are disposed flatly, it shows a electric field formed at circumference thereof. In FIG. 1, the above electric charges exist in two on a predetermined plane parallel to the XY plane, electric potential in a plane 81 away from this plane by 0.01 angstrom with respect to the Z direction, a plane 82 away by 3 angstrom, and a plane 83 away by 6 angstrom, is represented by the concave and convex.

As shown in FIG. 1, although local existences of the electric charges by ions can be recognized in the distribution of electric potential in the plane 81 close to the above electric charges, they become unclear in the plane 82 and it becomes difficult to recognize even the existences of two ionic-bond molecules in the distribution of electric potential in the plane 83. However, when for instance, the plane 83 is assumed to be the measurement plane satisfying z=0 and the above-mentioned $\phi_z^{(q)}(x, y, 0)$ and $\phi_z^{(p)}(x, y, 0)$ is obtained by measurement, it becomes possible to calculate $\phi_z^{(q)}(x, y, z)$ in an arbitrary value of z by using the three-dimensional field obtaining method in accordance with the present invention and it is achieved to reproduce measured values (for example, electric force) coming from the electric potential in the plane 81 where measurement can not be performed directly. In addition, the above principle works out within the bounds where $\phi(x, y, z)$ satisfy the Laplace equation, and the three-dimensional field can be calculated within the bounds.

Next, discussion will be made on the method of measuring magnetic domains on a magnetic material which is a recording medium in the hard disk drive, by using a MFM (magnetic force microscopy), as an application example of the above three-dimensional field obtaining principle. In this application example, due to existence of the recording medium which is an object, a field of magnetic potential, which is a field satisfying the Laplace equation, is formed at circumference of the object, and obtained is a three-dimensional field in the broad sense, which corresponds to a magnetic field derived by differentiating this magnetic potential with respect to the z direction once.

Figure 2:
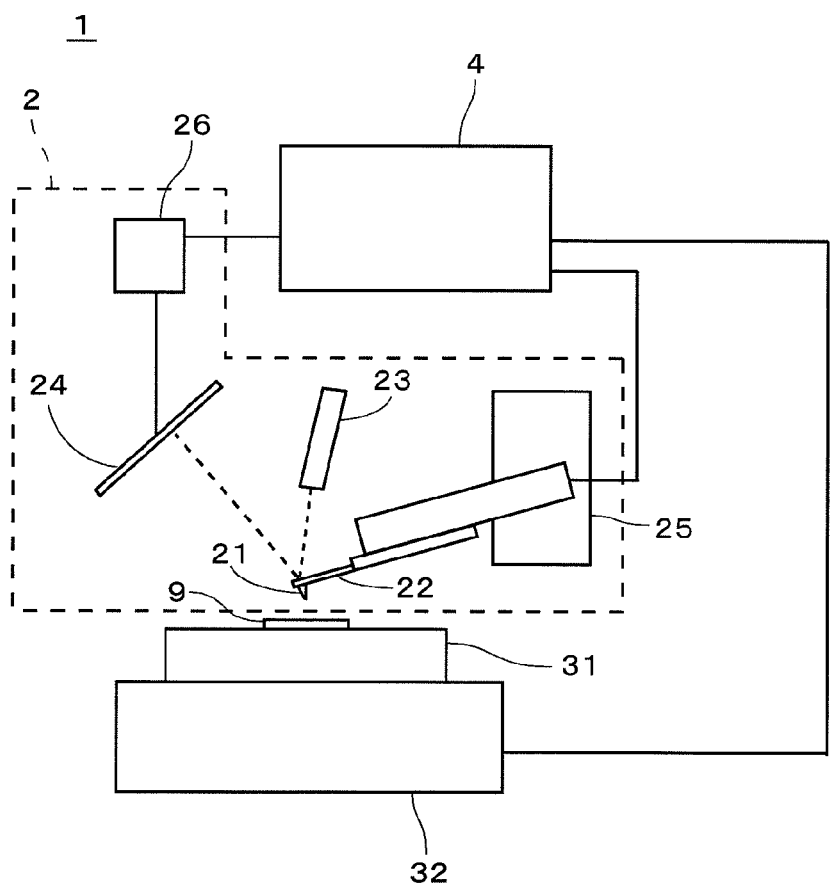
FIG. 2 is a view showing a schematic structure of a MFM in accordance with the first preferred embodiment.

FIG. 2 is a view showing a schematic structure of the MFM 1. The MFM 1 is an apparatus for detecting a polarized state in order to evaluate a sample 9 which is the recording medium recorded at high density in the hard disk drive, the ferroelectric memory or the rest. The MFM 1 comprises a head part 2 for detecting magnetic force, a sample table 31 for holding the sample 9, a horizontal moving mechanism 32 for moving the sample table 31 in a horizontal plane relatively to the head part 2, and a computer 4 for performing control of each part in the MFM 1 and calculation.

The head part 2 has a cantilever 22 in which a probe 21 is formed on a bottom surface of the tip, a laser 23 for emitting light toward the tip of cantilever 22, a light receiving device 24 for receiving reflected light from cantilever 22, an elevating mechanism 25 for elevating the cantilever 22, and an A/D converter 26 to which signal is input from light receiving device 24. The probe 21 has a part which is made by magnetizing a magnetic material and sharpening it, or a coating of a magnetized magnetic material on its surface, and magnetic force works between the probe 21 and sample 9. Therefore, the position of the tip of cantilever 22 changes in accordance with the magnetic force. An amount of change of the tip position comes to an amount of change of the light receiving position of the reflected light in the light receiving device 24 and the signal indicating the amount of change detected in the light receiving device 24 is converted to digital signal by the A/D converter 26 to be input to the computer 4. The horizontal moving mechanism 32 moves the sample 9 two-dimensionally in the horizontal direction by a minute distance with use of a piezoelectric device, and the elevating mechanism 25 elevates the cantilever 22 by a minute distance with use of a piezoelectric device.

Figure 3:
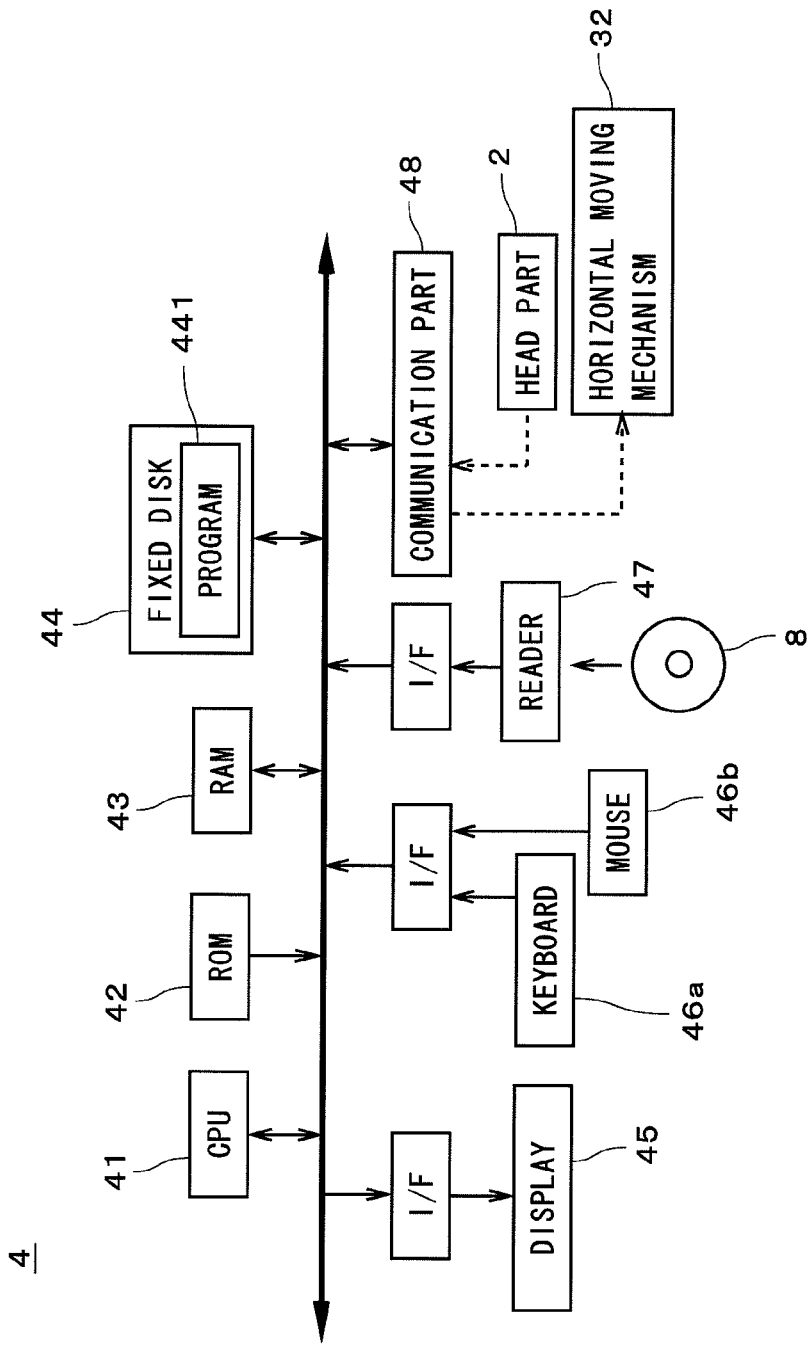
FIG. 3 is a view showing a structure of a computer.

In the MFM 1, the magnetic force which works on the probe 21 is detected, and in effect, the magnetic force can be regarded as the Z component of the magnetic field at the position where the probe 21 exists. In other words, a distribution of one-time differential of the magnetic potential with respect to z is obtained as a two-dimensional image by two-dimensionally scanning the probe 21 in the horizontal direction in the MFM 1, and the head part 2 and the horizontal moving mechanism 32 are a measuring part for obtaining the distribution of measured values (i.e., measured value group) as an image As shown in FIG. 3, the computer 4 has a structure of general computer system where a CPU 41 for performing various computations, a ROM 42 for storing a basic program and a RAM 43 for storing various information are connected to a bus line. To the bus line, a fixed disk 44 for storing information, a display 45 for displaying various information, a keyboard 46a and a mouse 46b for receiving an input from an operator, a reader 47 which reads information from a computer-readable recording medium 8 such as an optical disk, a magnetic disk or a magneto-optic disk, and a communication part 48 which sends control signal to the head part 2 and the horizontal moving mechanism 32 and to which the signal from the A/D converter 26 is input, are further connected through interfaces (I/F) as appropriate.

In the computer 4, a program 441 is read out from the recording medium 8 through the reader 47 in advance and stored in the fixed disk 44. The program 441 is copied in the RAM 43, the CPU 41 performs a computation according to the program in the RAM 43 (that is, the computer 4 executes the program), and the MFM 1 operates as a three-dimensional field obtaining apparatus and magnetic domains on the surface of the sample 9 are obtained as an image as discussed later.

Figure 4:
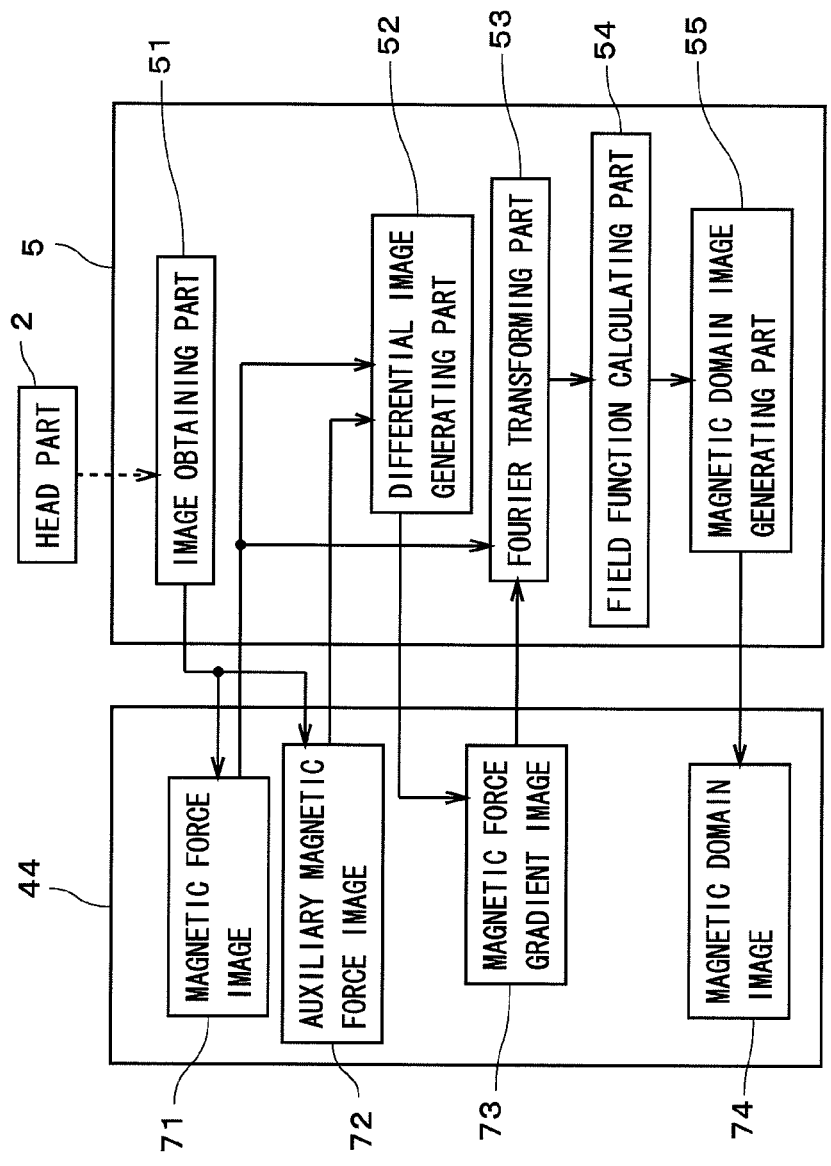
FIG. 4 is a block diagram showing a functional structure implemented by the computer.

FIG. 4 is a block diagram showing a functional structure, which the CPU 41, the ROM 42, the RAM 43, the fixed disk 44 and the rest implement by the execution of the CPU 41 according to the program 441, together with the head part 2 and data stored in the fixed disk 44. In FIG. 4, an operation part 5 including an image obtaining part 51, a differential image generating part 52, a Fourier transforming part 53, a field function calculating part 54 and a magnetic domain image generating part 55 shows the function implemented by the CPU 41 and the rest. These functions may be constructed as a dedicated electric circuit or a dedicated electric circuit may be partially used. A plurality of computers may implement them.

Figure 5:
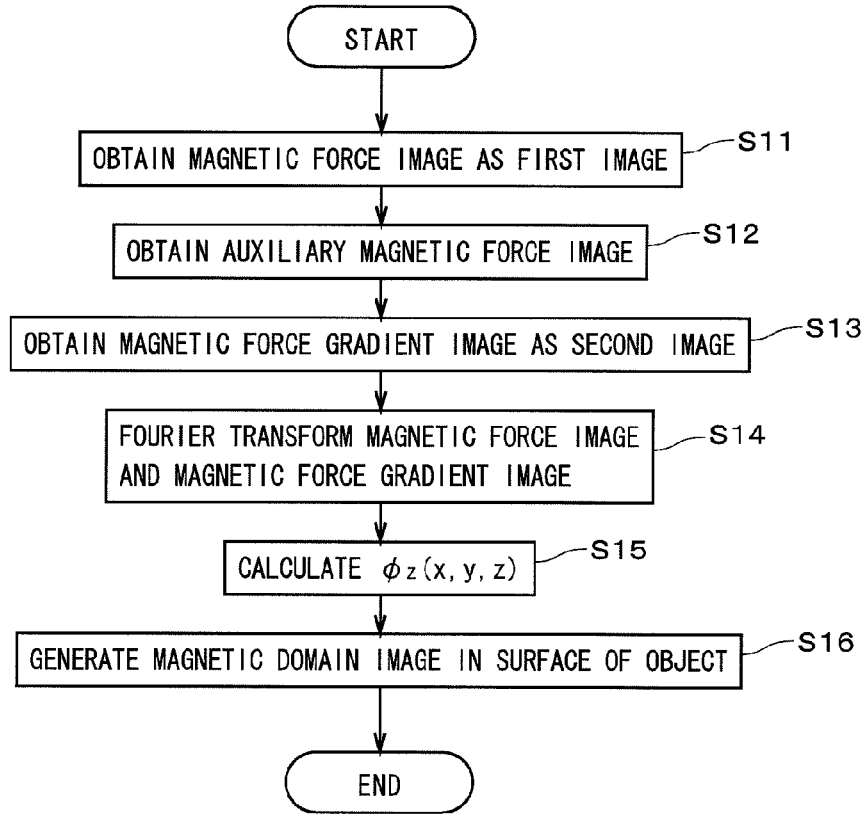
FIG. 5 is a flowchart showing an operation flow of the MFM.
Figure 6:
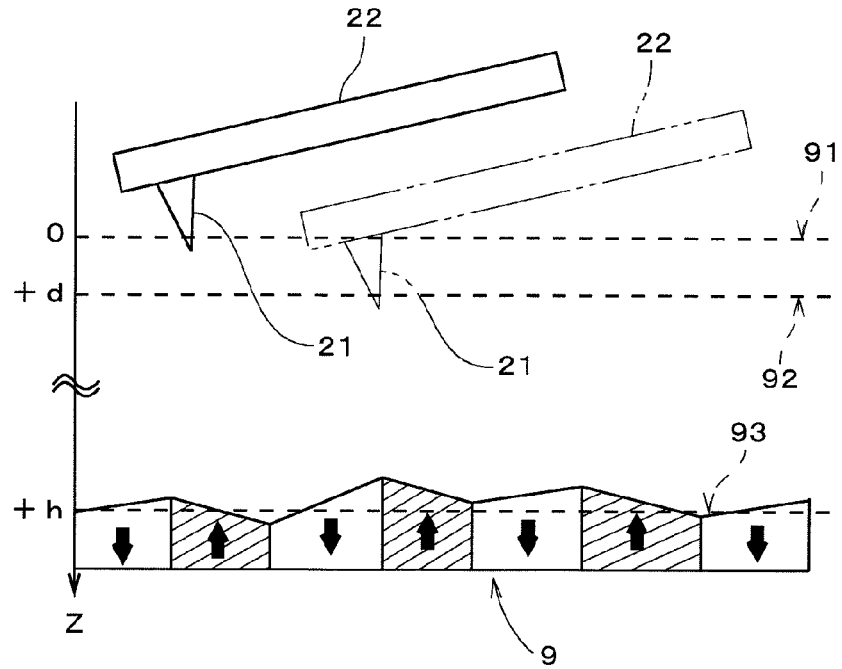
FIG. 6 is a view showing a schema of measurement by the MFM.

FIG. 5 is a flowchart showing an operation flow of the MFM 1 and FIG. 6 is a view showing a schema of measurement by the MFM 1. In the following discussion, the X direction and the Y direction in the rectangular coordinate system defined by the X, Y, Z directions which are orthogonal to one another in the previously mentioned three-dimensional field obtaining principle, are the horizontal directions, the Z direction is a direction heading toward the sample 9, the surface of the sample 9 is parallel to the XY plane, and as shown in FIG. 6, the surface 93 of the sample 9 is positioned at z=+h.

In the measurement by the MFM 1, first, the probe 21 is disposed on the measurement plane 91 which satisfies z=0 and is set at outside of the sample 9 which is an object as shown in FIG. 6. The sample table 31 is moved by the horizontal moving mechanism 32 shown in FIG. 2, and therefore main-scan of the probe 21 relative to the sample 9 is performed in the X direction and sub-scan of the probe 21 relative to the sample 9 is performed in the Y direction by a minute distance every time the main-scan is completed. While the main-scan and the sub-scan of the probe 21 are repeated, amounts of displacement of the probe 21 are detected as the magnetic force by the light receiving device 24 in the head part 2 and detected signal is input to the computer 4. The signal indicating the magnitude of the magnetic force is converted to pixel values by the image obtaining part 51 shown in FIG. 4 and a distribution of the magnetic force (i.e., a two-dimensional measured value group of the magnetic force) in the measurement plane 91 is stored in the fixed disk 44 (see FIG. 3) as a magnetic force image 71 (to be exact, data of an image) (FIG. 5: Step S11).

Next, the cantilever 22 goes down in the Z direction by a minute distance d (d>0) as shown by the double-dashed line in FIG. 6, by the elevating mechanism 25 shown in FIG. 2, scan of the probe 21 relative to the sample 9 is performed in the X and Y directions in the same way as Step S11, and a distribution of the magnetic force (i.e., a two-dimensional measured value group of the magnetic force) in a measurement plane 92 which is away from the measurement plane 91 in the Z direction by the minute distance d, is obtained as an auxiliary magnetic force image 72 (which corresponds to an intermediate measured value group discussed later) through the image obtaining part 51 (Step S12). After the magnetic force image 71 and the auxiliary magnetic force image 72 is prepared, a differential image (a differential measured value group) derived by dividing a difference image (a difference measured value group) between these images by the minute distance d, is generated by the differential image generating part 52 in the computer 4. The differential image becomes an image substantively indicating differential of the magnetic force with respect to the Z direction in the measurement plane 91, i.e., magnetic force gradient (in other words, the image is a differential measured value group which is a group of z differential values of the magnetic force). Thus, in the computer 4, this differential image is stored in the fixed disk 44 as a magnetic force gradient image 73 (Step S13).

Here, as described above, the magnetic force detected by the MFM 1 corresponds to the Z component of the magnetic field and corresponds to one-time differential of the field of magnetic potential with respect to z. Thus, when the field of magnetic potential satisfying the Laplace equation is represented by $\phi(x, y, z)$, the magnetic force image 71 becomes an image indicating $\phi_z^{(1)}(x, y, 0)$ (hereinafter, represented by $\phi_z(x, y, 0)$). On the other hand, since the magnetic force gradient is a function derived by further differentiating the magnetic force with respect to z, the magnetic force gradient image becomes an image indicating $\phi_z^{(2)}(x, y, 0)$ (hereinafter, represented by $\phi_{zz}(x, y, 0)$). In other words, when the magnetic force image 71 indicating $\phi_z(x, y, 0)$ is referred to as a first image (or a first measured value group, the same applies hereinafter), the auxiliary magnetic force image 72 indicating $\phi_z(x, y, d)$ is referred to as an intermediate image (or an intermediate measured value group, the same applies hereinafter), and the magnetic force gradient image 73 indicating $\phi_{zz}(x, y, 0)$ is referred to as a second image (or a second measured value group, the same applies hereinafter), Steps S11 to S13 become a process where the first image and the intermediate image indicating distributions of measured values of one type are obtained and the second image indicating a distribution of measured values of another type is calculated from these images. Furthermore, in different words, a process of calculating $\phi_z^{(q)}(x, y, 0)$ and $\phi_z^{(p)}(x, y, 0)$ in the principle of the three-dimensional field obtaining method is substantively performed by obtaining the first image in the MFM 1 and calculating differential in the vicinity of the first image. From the viewpoint of obtaining the magnetic force gradient which is measured values, it can be regarded that the differential image generating part 52 constitutes a measured value group obtaining part together with the head part 2 and the horizontal moving mechanism 32.

Next, the magnetic force image 71 which is $\phi_z(x, y, 0)$ and the magnetic force gradient image 73 which is $\phi_{zz}(x, y, 0)$ are input to the Fourier transforming part 53 of operation part 5 shown in FIG. 4, and they are Fourier transformed with respect to x and y, respectively, to calculate $\phi_z(k_x, k_y)$ and $\phi_{zz}(k_x, k_y)$ (where $k_x$, $k_y$ are wavenumbers in the X direction and the Y direction) (Step S14). Specifically, the two-dimensional discrete Fourier transform is performed as the Fourier transform, and in Fourier transforming, for example, employed is the technique of multiplying the both image by a sine function in the range of 0 to π which is regarded as a window function.

After $\phi_z(k_x, k_y)$ and $\phi_{zz}(k_x, k_y)$ are calculated, these are input to the field function calculating part 54 and $\phi_z(x, y, z)$ is calculated by the equation shown in Eq. 12 (the equation is hereinafter referred to as "a three-dimensional field obtaining equation"), with use of $\phi_z(k_x, k_y)$ and $\phi_{zz}(k_x, k_y)$ (Step S15). In the MFM 1, the equation where 1 is set to q and 2 is set to p in the three-dimensional field obtaining equation, is prepared in advance. When $\phi_z(k_x, k_y)$ and $\phi_{zz}(k_x, k_y)$ are substituted into the three-dimensional field obtaining equation and it is inverse Fourier transformed with respect to $k_x$, $k_y$, a window function similar to the function in Fourier transforming is used. A three-dimensional distribution of z component of magnetic field indicating the magnetic force is strictly calculated by calculating $\phi_z(x, y, z)$.

Next, in the case where a distance between the surface 93 of the sample 9 and the measurement plane 91 is h as shown in FIG. 6, a value (+h) indicating a position of the surface 93 (or a value indicating a position close to the surface 93) is substituted into z of $\phi_z(x, y, z)$ in the magnetic domain image generating part 55 and a magnetic force distribution in the surface 93 is obtained (Step S16). Since the magnetic domain structure in the surface 93 corresponds to the magnetic force distribution, an image indicating $\phi_z(x, y, +h)$ is stored in the fixed disk 44 as a magnetic domain image 74 indicating the magnetic domain structure in the MFM 1. With the above operation, it is possible to obtain the magnetic force image in the extreme vicinity of the surface 93 of the sample 9 in which measurement has heretofore been difficult because of great affection of the van der Waals force, and the MFM 1 with high spatial resolution equal to or less than 10 nm (and equal to or larger than 2 nm which is a curvature radius of the tip of the probe) is achieved.

Figure 7:
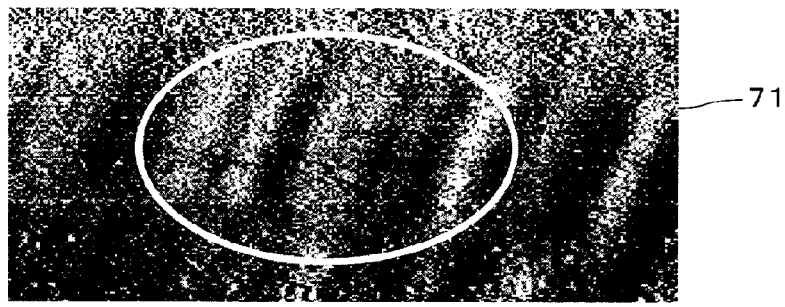
FIG. 7 is a view showing a magnetic force image.
Figure 8:
FIG. 8 is a view showing an auxiliary magnetic force image.
Figure 9:
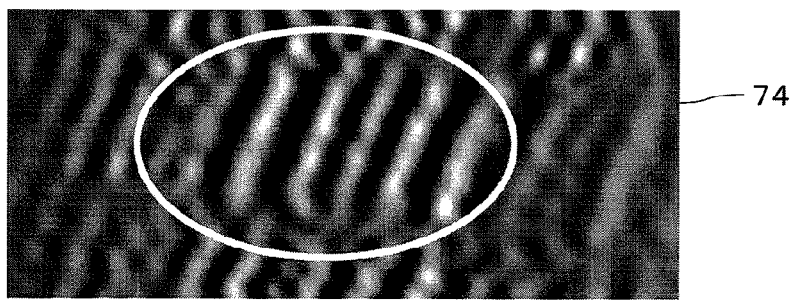
FIG. 9 is a view showing a magnetic domain image.

FIG. 7 is a view showing the magnetic force image 71 as an example, which the MFM 1 obtains in the measurement plane 91 where a distance from the surface of the sample 9 is 400 nm. And FIG. 8 is a view showing the auxiliary magnetic force image 72 which is obtained in the measurement plane 92 where a distance from the surface of the sample 9 is 300 nm, in a similar way. FIG. 9 is a view showing the magnetic domain image 74 obtained by the above three-dimensional field obtaining method with use of the images of FIGS. 7 and 8. In FIGS. 7 to 9, corresponding areas are surrounded by white lines. Though the image 71 and the image 72 are unclear, it is found that the obtained magnetic domain image 74 is clear.

Figure 10:
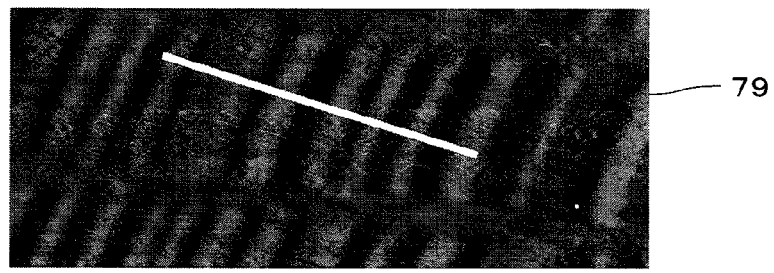
FIG. 10 is a view showing a magnetic force image obtained by actual measurement.
Figure 11:
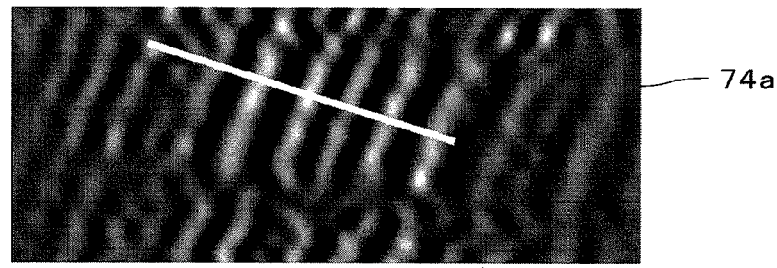
FIG. 11 is a view showing a reproduced magnetic force image.

FIG. 10 is a view showing a magnetic force image 79 which the MFM 1 obtains with a small clearance which is upward away from the surface 93 of the sample 9 by 20 nm, for the verification of the three-dimensional field obtaining method. FIG. 11 is a view showing a magnetic force image 74a in 20 nm from the surface 93 which is reproduced from the magnetic force images in the measurement plane 91 away from the surface 93 by 400 nm and the measurement plane 92 away from the surface 93 by 300 nm.

Figure 12:
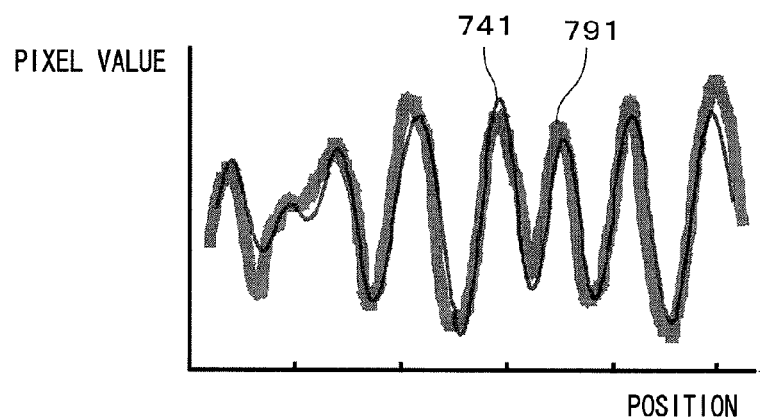
FIG. 12 is a view showing distributions of pixel values.

FIG. 12 is a view showing distributions of pixel values on the white lines shown in FIGS. 10 and 11, and it is a view showing distributions (profiles) of the magnetic force on the lines heading in arrangement directions of stripe patterns of dark and bright indicating the magnetic domain structures. The curved line 791 corresponds to FIG. 10 of the actually measured image and the curved line 741 corresponds to FIG. 11 of the reproduced image. The both curved lines 791 and 741 coincide accurately and clearly indicate existences of the magnetic domains. With the above, it is found that the three-dimensional field in the broad sense, which indicates the magnetic force, is accurately reproduced from the magnetic force image measured with a large clearance, by the three-dimensional field obtaining method performed in the MFM 1.

Figure 13:
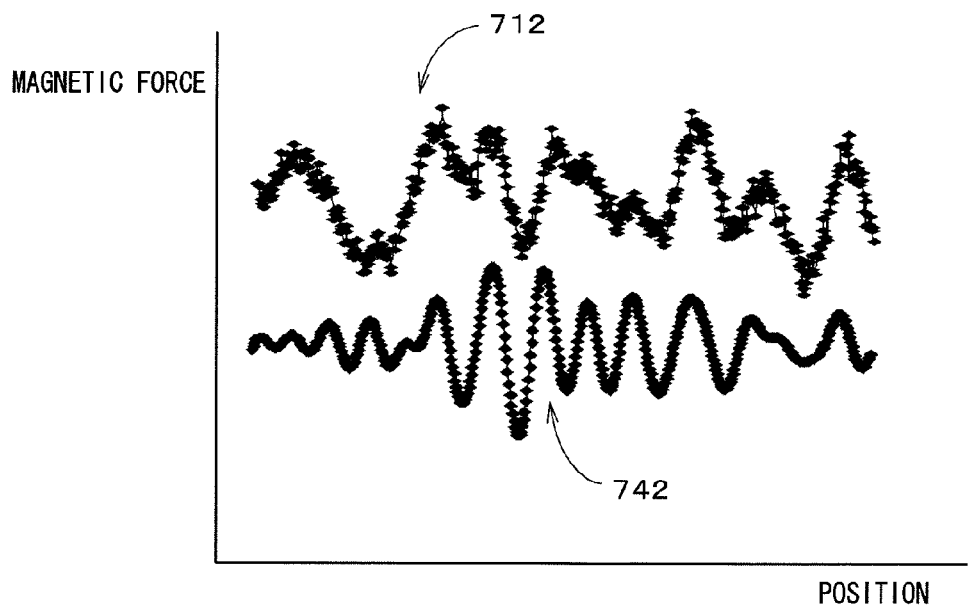
FIG. 13 is a view showing magnetic force distributions.

FIG. 13 is a view showing a magnetic force distribution at a position away from the surface 93 of the sample 9 by 300 nm and a magnetic force distribution reproduced at a distance of 20 nm from the surface 93. The curved line denoted by a reference sign 712 in FIG. 13 indicates the magnetic force distribution at the position away from the surface 93 by 300 nm and indicates the magnetic force distribution on the line crossing the magnetic domains in a similar fashion to the case of FIG. 12. The curved line denoted by a reference sign 742 indicates the magnetic force distribution reproduced in a plane away from the surface 93 by 20 nm. As shown in FIG. 13, it is found that the high accurate magnetic force distribution indicated by the curved line 742, that is the magnetic domain structure, is reproduced from information indicated by the curved line 712 whose relationship with the magnetic domain structure is almost unclear.

Figure 14:
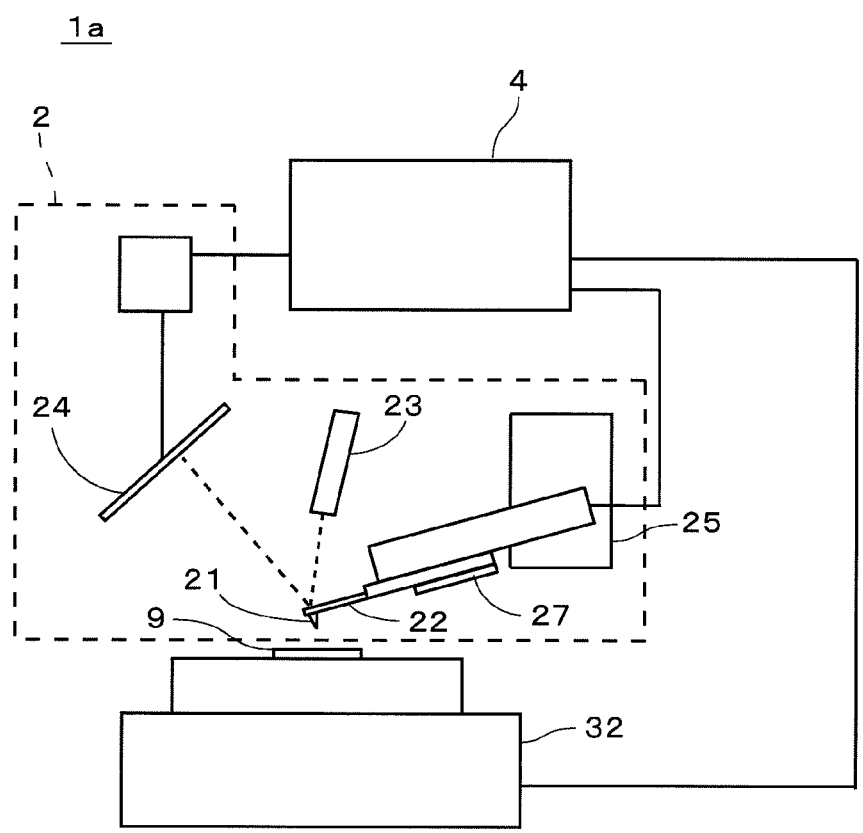
FIG. 14 is a view showing a schematic structure of a MFM in accordance with the second preferred embodiment.

FIG. 14 is a view showing a MFM 1a in accordance with the second preferred embodiment of the present invention. Though the MFM 1a has almost same structure as the MFM 1 of FIG. 2, the head part 2 is provided with a vibrating part 27 for vibrating the cantilever 22 and the functional structure of the computer 4 is partially different. Constituent elements other than those are identical to those of FIG. 2 and the same elements are denoted by the same reference signs.

The fixed end side of the cantilever 22 is connected with the vibrating part 27, and the cantilever 22 is excited up and down at a constant resonance frequency $\omega_0$ by a piezoelectric device of the vibrating part 27. In the same way as the MFM 1 in the first preferred embodiment, the upper surface of the free end side of the cantilever 22 is irradiated with light by the laser 23 and a position of reflected light is detected in the light receiving device 24. Therefore, respective amounts $\Delta\omega$ by which the resonance frequency $\omega_0$ of the cantilever is shifted due to interaction force relative to the sample, are detected by a frequency detector provided in the latter part, in addition to amounts of displacement of the cantilever 22 due to the magnetic force. Here, since the shift amounts $\Delta\omega$ of frequency can be regarded as modulations of conservative force component in vibration of the cantilever due to the interaction and the shift amounts $\Delta\omega$ are measured amounts coming from conservative force gradient, a magnetic force gradient image is obtained on the basis of the shift amounts $\Delta\omega$ of the resonance frequency of the cantilever in the MFM 1a.

Figure 15:
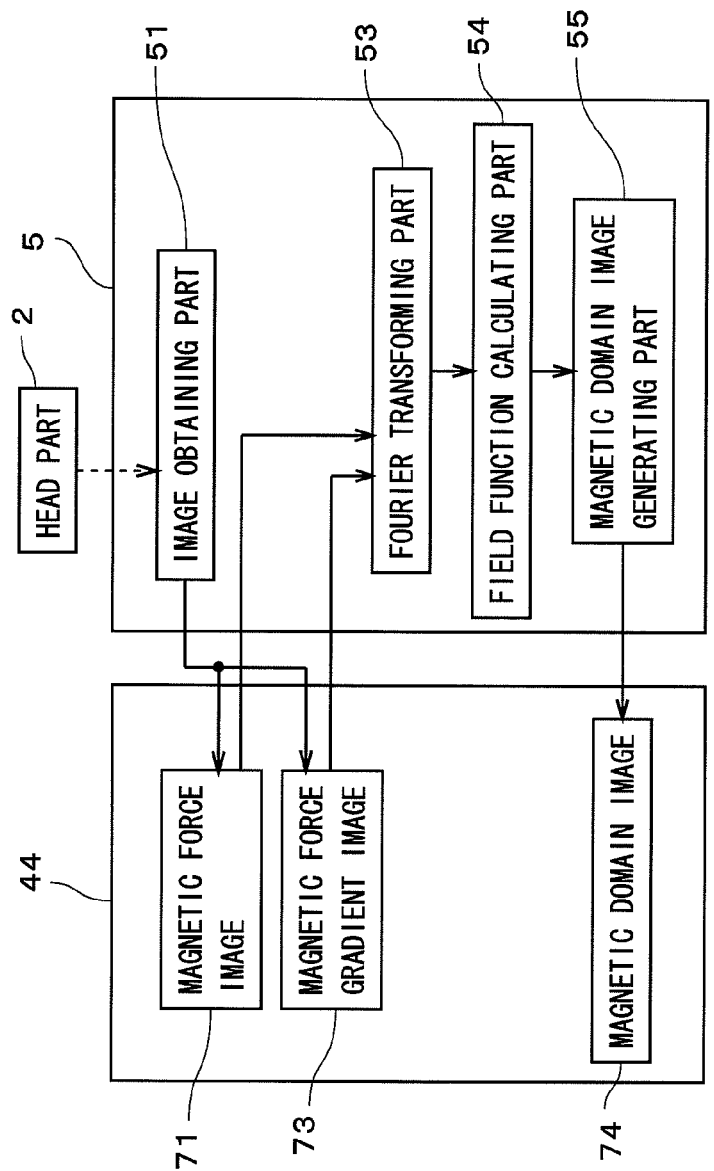
FIG. 15 is a block diagram showing a functional structure implemented by the computer.

FIG. 15 is a block diagram showing a functional structure in the computer 4 of the MFM 1a. The computer 4 of the MFM 1a is different from one of FIG. 4 in points where the magnetic force image 71 and the magnetic force gradient image 73 are directly generated by the image obtaining part 51 and the differential image generating part 52 is omitted. Constituent elements other than those are identical to those of FIG. 4 and the same elements are denoted by the same reference signs.

Figure 16:
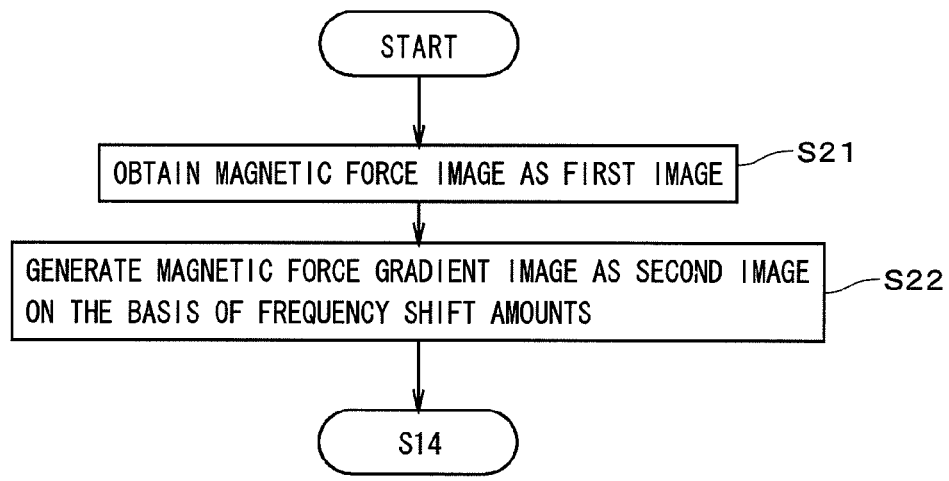
FIG. 16 is a flowchart showing a part of operation flow of the MFM.

FIG. 16 is a flowchart showing a part of operation flow of the MFM 1a. In the MFM 1a, first, the probe 21 is disposed on the measurement plane 91 shown in FIG. 6 and the cantilever 22 (and the probe 21) shown in FIG. 14 is forcedly vibrated at the resonance frequency $\omega_0$. And, in this state, the sample 9 is scanned two-dimensionally in the XY directions by the horizontal moving mechanism 32, in the same way as Step S11 of the MFM 1 in the first preferred embodiment. At this time, the magnetic force image 71 indicating a distribution of the magnetic force is obtained as a first image by the image obtaining part 51 of FIG. 15, on the basis of the amounts of displacement of the cantilever 22 detected by the light receiving device 24 (Step S21), and the magnetic force gradient image 73 is generated from the frequency shift amounts $\Delta\omega$ output by the frequency detector, to be stored in the fixed disk 44 as a second image (Step S22).

Processes after obtaining the magnetic force image 71 and the magnetic force gradient image 73, are same as Step 14 (FIG. 5) and later in the first preferred embodiment, the field of the magnetic force in the Z direction is obtained by Fourier transforming these images in the Fourier transforming part 53 and substituting them into the three-dimensional field obtaining equation in the field function calculating part 54, and the magnetic domain image 74 is obtained by substituting +h (or a value indicating a position close to the surface 93) into z in the magnetic domain image generating part 55 (Steps S14 to S16). As described above, in the MFM 1a in accordance with the second preferred embodiment, the images of measured values of two types arising from existence of the sample 9 are obtained by one-time measurement in the measurement plane 91, to perform reproduction of the three-dimensional field. In addition, one-time differential of the magnetic potential with respect to z may be detected by detecting a change amount of amplitude in the tip of the cantilever 22 (i.e., a change amount of strength of modulated signal from the light receiving device 24) in light receiving device 24.

Figure 17:
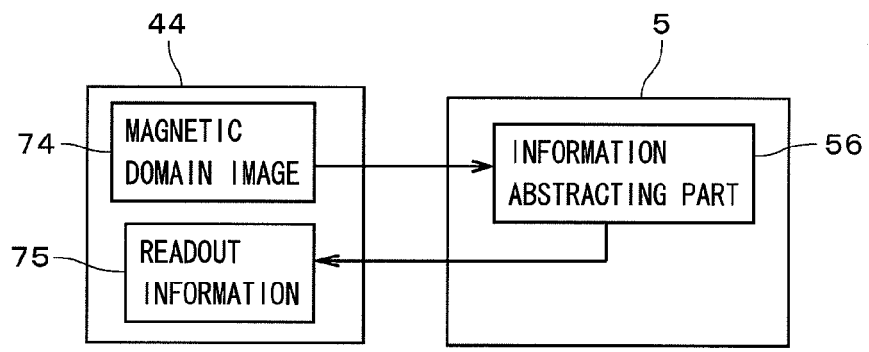
FIG. 17 is a block diagram showing a part of functional structure of an information reading apparatus.
Figure 18:
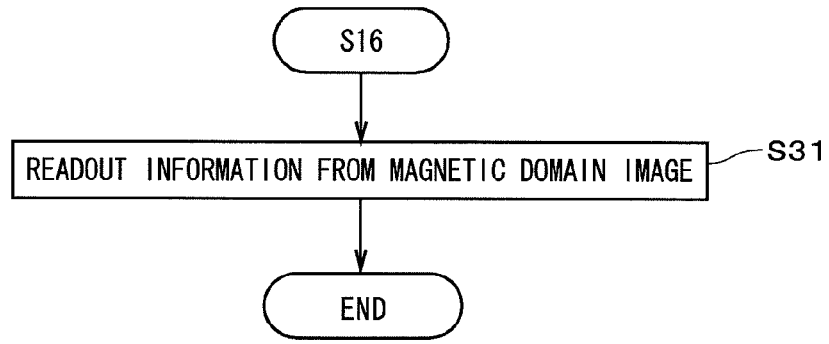
FIG. 18 is a flowchart showing a part of operation flow of the information reading apparatus.

Next, discussion will be made on an application example where the MFM 1 of FIG. 2 is used as an information reading apparatus. FIG. 17 is a block diagram showing an information abstracting part 56 added to the operation part 5 of the MFM 1 which is the information reading apparatus and FIG. 18 is a flowchart showing a process added to the operation of the MFM 1.

Also, in the case where information recorded on a surface of a recording medium (corresponding to the sample 9 of FIG. 6) is read in the MFM 1, first, Steps S11 to S16 of FIG. 5 are performed in the MFM 1 so that a magnetic domain image 74 is obtained in the fixed disk 44. After that, the information abstracting part 56 of the operation part 5 obtains a pixel value row along a line parallel to the arrangement of magnetic domains which are units of information, in the magnetic domain image 74 and binarizes pixel values by a predetermined threshold value to obtain a magnetized state of each magnetic domain as binary readout information 75 (Step S31).

Since the current hard disk drive employs the flying head system, detectable spatial resolution is capped by the flying distance, and the resolution is improved by miniaturization of head structure and heightening the sensitivity. However, in the MFM 1, the magnetic domain structure of the surface of the recording medium can be calculated accurately by the technique on the basis of a unique idea where the three-dimensional field is reproduced, and therefore information can be readout, even if it is recorded at an extremely high density. Especially, information recorded at high density can be readout without contact with the probe, and there is a feature that wear of the probe does not occur. The readout resolution is determined from curvature radius size of the tip of the probe 21. Also, the above information reading apparatus may be achieved by the MFM 1a of FIG. 14. In the case where the MFM 1 and 1a are used for measurement in another application, it is achieved to perform the measurement at high spatial resolution.

Figure 19:
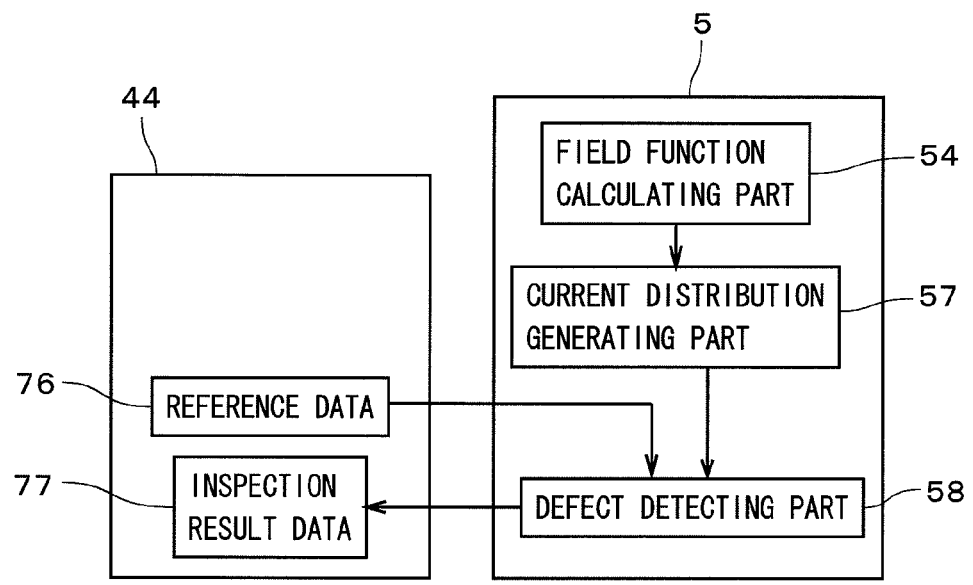
FIG. 19 is a block diagram showing a part of functional structure of a circuit inspection apparatus.
Figure 20:
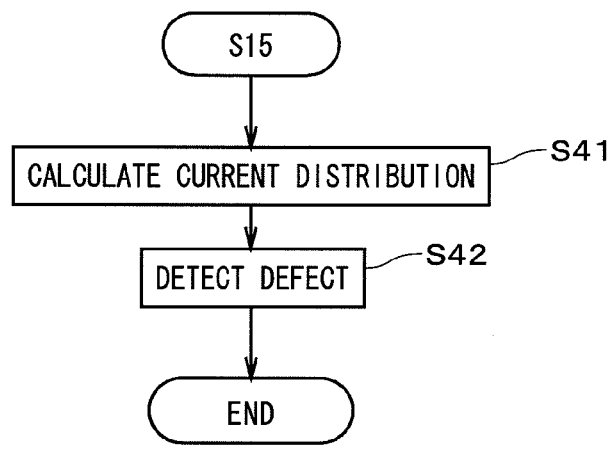
FIG. 20 is a flowchart showing a part of operation flow of the circuit inspection apparatus.

Next, discussion will be made on an application example where the MFM 1 of FIG. 2 is used as an circuit inspection apparatus for a semiconductor device. The circuit inspection apparatus is an apparatus for inspecting a defect such as disconnection and short-circuiting on an electric circuit formed inside the semiconductor device through processes such as CMP in manufacture of the semiconductor device, and the circuit inspection apparatus comprises a function of a current distribution measuring apparatus for measuring a current distribution flowing through an electric circuit of inside of an object. FIG. 19 is a block diagram showing functional constituents added to or changed from the operation part 5 of the MFM 1 which is the circuit inspection apparatus (or the current distribution measuring apparatus), and FIG. 20 is a flowchart showing processes added to or changed from the operation of the MFM 1. As shown in FIG. 19, in the operation part 5, the magnetic domain image generating part 55 of FIG. 4 is changed to a current distribution generating part 57 and a defect detecting part 58 is added. In the operation of the MFM 1, Steps S41 and S42 shown in FIG. 20 are performed after Step S15 of FIG. 5. In the case where scan area of the probe 21 is large in the MFM 1, a different mechanism such as a feed screw mechanism may be employed to the horizontal moving mechanism 32.

In the MFM 1 regarded as the circuit inspection apparatus, inspection is performed in the state where the probes contact electrodes on the semiconductor device (LSI) (corresponding to the sample 9 of FIG. 6) which is an object of inspection and the circuit of inside is supplied with the current. The electric circuit which is a target of inspection may be such as a semiconductor element, an interconnection between elements and a multilayer printed circuit board (before and after mounting electronic components) other than the semiconductor device. By supplying inside of the semiconductor device with the current, a field of the magnetic potential which is a three-dimensional scalar field, is formed at not only circumference of the semiconductor device, but also inside thereof.

Figure 21:
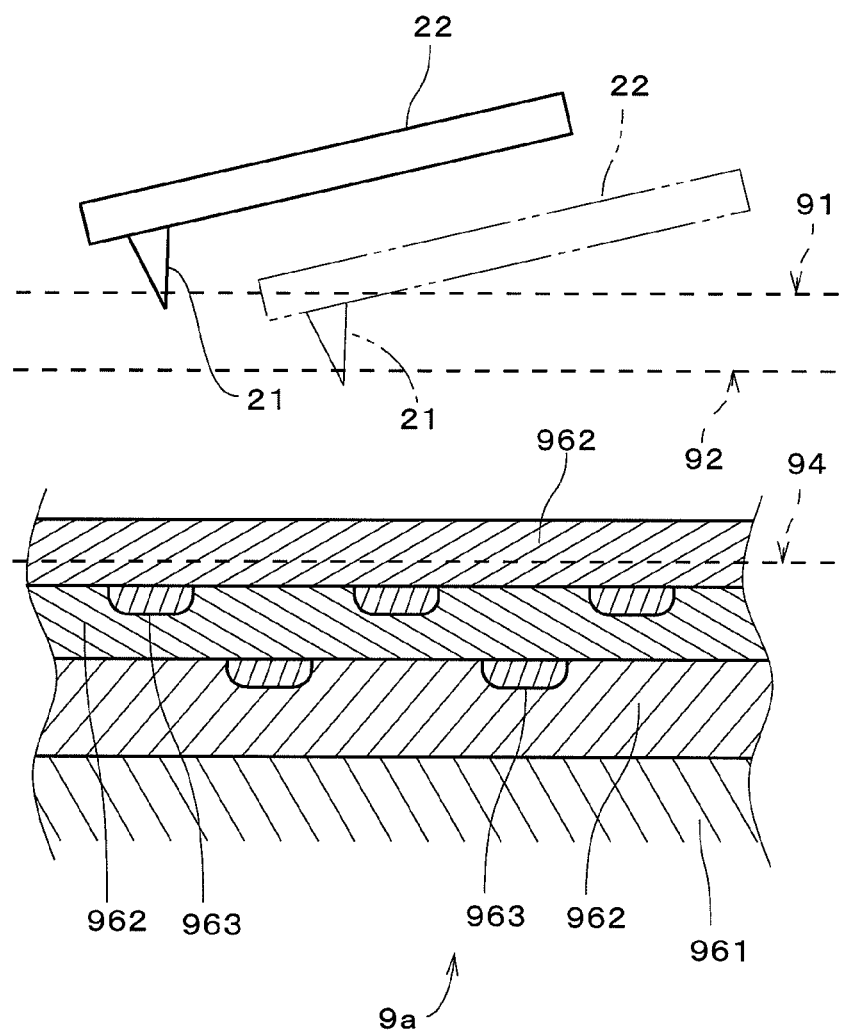
FIG. 21 is a view showing a schema of inspection by the circuit inspection apparatus.

FIG. 21 is a view for an explanation of inspection of the semiconductor device 9a and it shows an appearance in cross section where a plurality of oxide films 962 are stacked on a semiconductor base member 961 of the semiconductor device 9a and circuit wires 963 are formed among layers.

In circuit inspection by the MFM 1, first, scan of the probe 21 is performed on the measurement plane 91 in the state where circuit wires 963 are supplied with the current, the magnetic force image 71 in the measurement plane 91 is obtained on the basis of the amounts of displacement of the cantilever 22 (FIG. 5: Step S11), and the same measurement is performed in the measurement plane 92 away from the measurement plane 91 in the Z direction (a direction approaching to the semiconductor device) by a minute distance, to obtain the auxiliary magnetic force image 72 (Step S12). And the magnetic force gradient image 73 is obtained from the magnetic force image 71 and the auxiliary magnetic force image 72 (Step S13). These images are Fourier transformed and substituted into the three-dimensional field obtaining equation (see Eq. 12) where q is 1 and p is 2, in the field function calculating part 54 shown in FIG. 19, and therefore, obtained is the field function $\phi_z(x, y, z)$ of the three-dimensional field in the broad sense, which indicates a distribution of the magnetic force caused by the current flowing through the circuit (Step S14 and S15).

In addition, as described above, since acquisition of the three-dimensional field is performed in a space satisfying the Laplace equation (i.e., the space where a current source and a magnetic charge (a magnetic monopole) do not exist), it is achieved to calculate even the three-dimensional field which comes from magnetic potential caused by the current intricately flowing in the three-dimensional space.

In the current distribution generating part 57, a value of z indicating a position inside the semiconductor device 9a which is denoted by a reference sign 94 in FIG. 21, is substituted into $\phi_z(x, y, z)$ to calculate the magnetic force image in inside of the semiconductor device 9a as a substitution result. Furthermore, the current distribution flowing through the uppermost circuit wires 963 in the semiconductor device 9a is obtained on the basis of the magnetic force image (FIG. 20: Step S41). For example, a position where a value of the magnetic force becomes extremely great in substituting a value of z, is obtained as a current path and the current value is calculated from the distribution of the magnetic force. The obtained current distribution need not be a accurate one, it need only be able to verify the presence or absence of the current flowing the circuit wires 963. A plurality of magnetic force images in different values of z may be calculated, to obtain the current distribution more accurately on the basis of these images. Furthermore, as described above, a three-dimensional distribution of the current flowing through circuit wires 963 other than the uppermost circuit wires 963 may be calculated from a field calculated three-dimensionally, to the extent possible.

Next, in the defect detecting part 58, the current distribution obtained by the current distribution generating part 57 is compared with reference data 76 which represents an ideal current distribution and which is prepared in the fixed disk 44 in advance, for example, to calculate the difference, and therefore, a defect such as disconnection or short-circuiting on the circuit wires 963 is detected. The detection result by the defect detecting part 58 is stored in the fixed disk 44 as inspection result data 77. With the above operation, in the MFM 1 which functions as the circuit inspection apparatus, it is possible to inspect the defect such as disconnection on the circuit inside the semiconductor device 9a in a noncontact and nondestructive manner.

Though the method of calculating the field of the magnetic force (i.e., the field showing the distribution of the Z-directional components in the magnetic field) accurately by obtaining the magnetic force image and the magnetic force gradient image with use of the MFM and its application examples have been discussed above, but the three-dimensional field obtaining equation can be used for various applications other than the above.

For example, values set to q and p in the three-dimensional field obtaining equation are not limited to 1 and 2. A magnetic force gradient image is obtained as the first image by obtaining shift amounts of vibration frequency of the probe 21 in the measurement plane 91 of FIG. 6 by the MFM 1a of FIG. 14, a magnetic force gradient image is obtained as the intermediate image by the same way in the measurement plane 92 away from the measurement plane 91 by a minute distance, and a differential image derived by dividing a difference image between the first image and the intermediate image by the minute distance d may be obtained as the second image which shows differential of the magnetic force gradient with respect to z. In this case, since the first image corresponds to $\phi_{zz}(x, y, 0)$ and the second image corresponds to $\phi_{zzz}(x, y, 0)$, these images are Fourier transformed and substituted into the three-dimensional field obtaining equation where 2 and 3 are set to q and p, and therefore, $\phi_{zz}(x, y, z)$ are calculated. Also, the three-dimensional field obtaining equation where 0 is set to q, like electric potential, temperature and the rest, can be used easily. Since the three-dimensional field obtaining equation can be used in the case where p, q are integers which are equal to or larger than 0, and one of them is odd and the other is even, the three-dimensional field obtaining equation where values other than the values in the above examples are set to q and p, can be used by performing other measurement.

The three-dimensional scalar field which becomes a basis of a field to be reproduced, that is the three-dimensional scalar field which is formed at least at circumference or inside of an object due to existence of the object, is not limited to the field of magnetic potential as long as it satisfies the Laplace equation, and the field of electric potential can be quoted as a example where the three-dimensional field obtaining method can be applied easily. In this case, for example, the sample 9 is one where the electric charges exist on the surface thereof as shown in FIG. 1 as an example, an insulating body is formed around the probe 21 and the probe 21 is made to hold electric charges, and therefore, an electric force image indicating a distribution of the electrostatic force due to existence of the sample 9 is obtained as the first image from the amounts of displacement of the cantilever 22 (see FIG. 5). After that, the differences between two electric force images where positions of the measurement planes with respect to the Z direction differ by a minute distance, are divided by the minute distance to obtain a electric force gradient image as the second image. These images are Fourier transformed and substituted into the three-dimensional field obtaining equation (where 1 is set to q and 2 is set to p), and therefore, reproduced is the three-dimensional field in the broad sense, which indicates the electric force (the Z-directional components in the electric field). Furthermore, the value of z which indicates the position of the surface (or the vicinity of the surface) of the sample 9 is substituted into the reproduced field function, and an image indicating a distribution of the electric force on the surface of the sample 9 is calculated as an image corresponding to a distribution of the electric charges. It is therefore possible to accurately calculate the three-dimensional distribution of the electric charges from the position away enough from the sample 9, without being affected by atomic force, and for example, in the case where electric charges are distributed three-dimensionally in an insulating film, it is achieved to specify a position where electric charges are trapped, from the field which the electric charges generate far from them.

As a matter of course, in the same way as the case of the MFM 1a, $\phi_{zz}(x, y, 0)$ may be calculated by obtaining the electric force gradient image from shift amounts of vibration frequency of the cantilever 22, furthermore, $\phi_{zzz}(x, y, 0)$ may be calculated from the two electric force gradient images at the positions away from each other by a minute distance. In the same way as the information reading apparatus using the MFM, in the case where an object holding electric charges is employed as the recording medium, it is possible to design an information reading apparatus using the field of electric potential. In this case, for example, electric charges, dipoles, multiple dipoles or the rest implanted to the recording medium are regarded as minimum units of information recording.

In the meantime, in the case where electric charges are induced to the probe 21 and an amount of induced electric charges is a function of the electric field, F(x, y, 0) which indicates the electric force image in the measurement plane satisfying z=0, is proportional to the square of $\phi_z(x, y, 0)$ and it is represented by Eq. 13. In Eq. 13, c is constant. Also, by differentiating Eq. 13 with respect to z, $F_z(x, y, 0)$ indicating the electric force gradient image is represented by Eq. 14.

$$F(x,y,0)=c\phi_z(x,y,0)^2 \quad \text{(Eq. 13)}$$

$$F_z(x,y,0)=2c\phi_z(x,y,0)\phi_{zz}(x,y,0) \quad \text{(Eq. 14)}$$

And, $\phi_z(x, y, 0)$ and $\phi_{zz}(x, y, 0)$ are obtained as Eq. 15 and Eq. 16 by solving simultaneous equations of Eq. 13 and Eq. 14. As above, even in the case where electric charges are induced to the probe 21, the three-dimensional field obtaining equation can be used.

$$\phi_z(x, y, 0) = \sqrt{\frac{F(x, y, 0)}{c}} \quad \text{(Eq. 15)}$$

$$\phi_{zz}(x, y, 0) = \frac{F_z(x, y, 0)}{2\sqrt{F(x, y, 0)c}} \quad \text{(Eq. 16)}$$

In the general expression, a distribution of measured values of one type which comes from a three-dimensional scalar field, is obtained in a measurement plane as a two-dimensional first measured value group, a distribution of measured values of another type which comes from the three-dimensional scalar field, is obtained in the measurement plane as a two-dimensional second measured value group, $\phi_z^{(q)}(x, y, 0)$ and $\phi_z^{(p)}(x, y, 0)$ which are q times differential and p times differential of $\phi(x, y, z)$ in the measurement plane with respect to z, are calculated on the basis of the first measured value group and the second measured value group, and it is therefore possible to Fourier transform these functions and substitute them into the three-dimensional field obtaining equation.

Furthermore, in different words, if measured amounts are functions $s_i(\phi_z, \phi_{zz})$ of a field (where i is the number of signals which obtain images by measurement) and boundary values $b_i(\phi_z, \phi_{zz})$ are obtainable, $\phi_z(x, y, 0)$ and $\phi_{zz}(x, y, 0)$ are calculated by solving simultaneous equations and the three-dimensional field obtaining equation can be used. To be extended further, if measured amounts are $s_i(\phi^{(0)}, \phi^{(1)}, \phi^{(2)}, \phi^{(3)}, \ldots)$, boundary values $b_i(\phi^{(0)}, \phi^{(1)}, \phi^{(2)}, \phi^{(3)}, \ldots)$ are obtainable and multiple simultaneous equations can be solved, $\phi^{(0)}, \phi^{(1)}, \phi^{(2)}, \phi^{(3)}, \ldots$ in z=0 can be calculated and various three-dimensional fields can be reproduced with use of the three-dimensional field obtaining equation.

And, with the above reproduction of the three-dimensional field, it is achieved to accurately perform desired measurement in the surface or inside of the object from measurement in the measurement plane away from the surface.

In the MFM 1 in accordance with the first preferred embodiment, the first image is the magnetic force image, the second image is the magnetic force gradient image derived from the magnetic force image and the auxiliary magnetic force image, $\phi_z(x, y, 0)$ is obtained by acquisition of the first image, and $\phi_{zz}(x, y, 0)$ is obtained by acquisition of the second image. As above, the MFM 1 is a particular one of the above general technique where the first and second images are derived from two types of measured values. As described above, there may be a case where the first image is the gradient image of the magnetic force or the electric force and the second image is the image indicating differential of the gradient of the magnetic force or the electric force with respect to z. In the above technique of calculating the three-dimensional field by obtaining two distributions of measured values of one type in the measurement planes away from each other in the Z direction by the minute distance, p is made to (q+1), the image showing $\phi_z^{(q)}(x, y, 0)$ is obtained as the first image, the distribution of measured values of one type in the plane away from the measurement plane by the minute distance with respect to the Z direction is obtained as the two-dimensional intermediate image, the differential image derived by dividing the difference image between the first image and the intermediate image by the minute distance is obtained as the second image, and the process of calculating $\phi_z^{(q)}(x, y, 0)$ and $\phi_z^{(p)}(x, y, 0)$ is substantially performed by acquisition of the first image and the second image. This makes it possible to derive the distribution of measured values of another type from the distribution of measured values of one type and the three-dimensional field can be calculated easily and accurately.

Furthermore, the three-dimensional field obtaining equation can be used for a function of an arbitrary field satisfying the Laplace equation, and it can be applied to a field of temperature, a field of gravity potential, a field of atomic force, strain potential, an acoustic field and a near field (the same applies to obtaining of an n-dimensional field discussed later). For example, in order to find out internal structure of an object, the steady-state flow of heat is induced inside the object, temperature measurement and temperature gradient measurement are performed in the vicinity of the object with use of a thermocouple or a probe which is the sharpened tip of the thermocouple, and therefore, a temperature distribution inside the object can be obtained. In other words, in the three-dimensional field obtaining method in accordance with the present invention, measurement derived from the three-dimensional field (in the broad sense) is performed at a position away from the object, and it is therefore achieved to comprehend a various three-dimensional field within the limit to satisfy the Laplace equation (for example, within a zone infinitely close to a charged particle in the Poisson equation), the state of a field in the vicinity of or inside the object and so on.

Next, discussion will be made on application examples where the three-dimensional field obtaining method discussed above is used for other various apparatuses.

Figure 22:
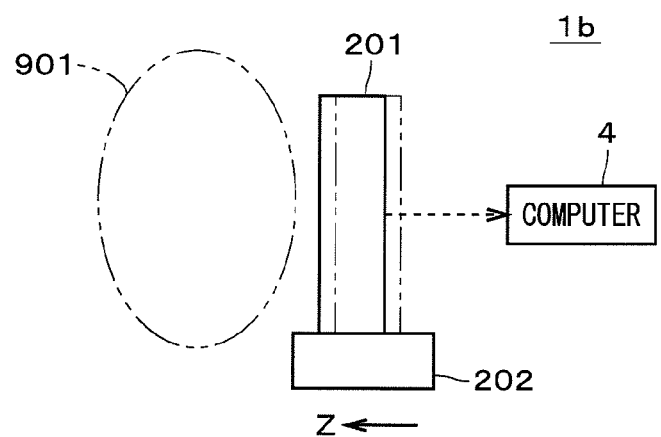
FIG. 22 is a view showing a biomagnetic field measuring apparatus.

FIG. 22 is a view showing a biomagnetic field measuring apparatus 1b to which the three-dimensional field obtaining method is applied. The biomagnetic field measuring apparatus 1b comprises a measuring part 201 in which many superconducting quantum interference devices (SQUIDs) are two-dimensionally arranged, and a moving mechanism 202 for moving the measuring part 201 in a direction (the Z direction in FIG. 22) heading toward a living body 901. The measuring part 201 is connected with the computer 4 which includes the operation part having the same function as that in FIG. 4. The differential of a field of magnetic potential respect to the Z direction (i.e., the Z-directional components of the magnetic field) in the arrangement plane of the SQUIDs which is orthogonal to the Z direction, is obtained as an image by one-time measurement in the measuring part 201. And, after the first image is obtained by the measuring part 201 in a similar fashion to the operation shown in FIG. 5 (Step S11), the measuring part 201 is moved in the Z direction by a minute distance to obtain the intermediate image (Step S12), and the differential image derived by dividing the difference image between the first image and the intermediate image by the minute distance, is obtained as the second image (Step S13).

Furthermore, the first image and the second image are Fourier transformed and substituted into the three-dimensional field obtaining equation, and therefore, differential of the field of the magnetic potential inside the living body with respect to the Z direction, is obtained (Steps S14 and S15). As the result, the three-dimensional magnetic field (in the more general expression, the three-dimensional field of the magnetic potential or the three-dimensional field derived from the field of the magnetic potential) caused due to the current flowing inside the living body, is measured and high accuracy inspection of inside of the living body is achieved. If differential values can be measured directly, the differential image may be obtained by another technique.

The target as the living body 901 is such as the heart, the brain and the lung, thus, the biomagnetic field measuring apparatus 1b functions as a magnetorocardiography, a magnetoencepharography, a magnetopneumography and the rest which observe the electric activities of these organs by the magnetic fields. In the case where it functions as the magnetorocardiography, a three-dimensional magnetocardiogram is obtained, and for example, it is achieved to identify cause for the ischemia, a part where myocardial infarction occurs, signal source of arrhythmia and the rest. The magnetic field at circumference of the living body may be caused due to magnetic particles administered to the living body. For example, the magnetic particles are contained in antibodies binding to tumor cells, pathogens or the rest, these antibodies are administered, the magnetic field of the living body is measured by the above technique, and therefore, three-dimensional measurement of the lesion part may be performed.

The MFM in the above preferred embodiments can be applied to a diagnostic apparatus of a target substance such as pathogenic bacterium, virus, cancer, AIDS cell, DNA gene, environmental toxin. For example, antigens are adsorbed on a substrate whose surface is provided with antibodies for binding, antibodies adsorbing magnetic particles are allowed to bind to a two-dimensional distribution of the antigens, a two-dimensional magnetic field distribution (to be exact, the Z-directional components of the magnetic field) is measured relatively to this by the MFM (or the SQUID magnetic sensor), the three-dimensional field is obtained by the technique of FIG. 5 or FIG. 16, and therefore, an amount of the antigens can be measured accurately. The measurement result is used for the diagnostic of pathogenic bacterium, virus, cancer, AIDS cell, hepatitis and the rest. In the case where measurement of environmental toxins is performed, magnetic particles which bind to the environmental toxins are used. By calculating an exact solution of the three-dimensional field, accurate measurement can be performed even in the case where target substances to be measured exist densely on the substrate.

Next, discussion will be made on a nondestructive inspection apparatus to which the three-dimensional field obtaining method is applied. The nondestructive inspection apparatus is an apparatus for nondestructively inspecting inside of a structure such as reinforced concrete. The construct of the apparatus is same as the biomagnetic field measuring apparatus 1b shown in FIG. 22 except for the point that those sizes differ, and the target is replaced with the structure. Also, the operation of obtaining the three-dimensional field (in the more general expression, a field of the magnetic potential or a three-dimensional field derived from the field of the magnetic potential) is same as the case of the biomagnetic field measuring apparatus 1b. It is therefore achieved to detect the magnetic field caused by residual stress of reinforcing bars and so on, or the magnetic field caused by charge transfer accompanying corrosion of concrete and so on, and it is achieved to inspect stress anomaly, velocity of corrosion and the rest inside the structure with high accuracy without destruction of the structure.

The measuring part 201 may be a mechanism which scans the SQUIDs two-dimensionally along the surface of the object and be a mechanism which scans a magnet two-dimensionally (the mechanism includes the MFM).

Figure 23:
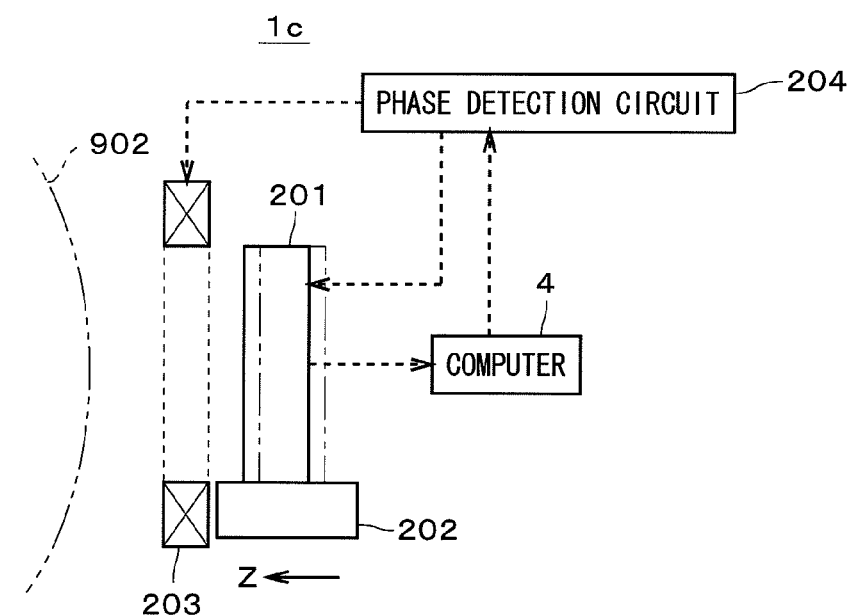
FIG. 23 is a view showing a nondestructive inspection apparatus.

FIG. 23 is a view showing another example of the nondestructive inspection apparatus, in the nondestructive inspection apparatus 1c shown in FIG. 23, the measuring part 201 where the SQUIDs are arranged two-dimensionally, is advanced and retracted toward the object 902 (in the Z direction) by the moving mechanism 202, in a similar fashion to the apparatus shown in FIG. 22. Furthermore, in the nondestructive inspection apparatus 1c, provided is exciting coil 203 which is disposed so as to surround the measuring part 201, and the exciting coil 203 which is a magnetic field generating part allows the magnetic field which varies periodically, to affect the object 902. Also, provided is a phase detection circuit 204 for abstracting signal from measurement signal by the measuring part 201 in synchronization with the magnetic field varying periodically by the exciting coil 203. As described above, in the nondestructive inspection apparatus 1c, a measured value group obtaining part for obtaining a distribution of the measured values as an image (i.e., measured value group) is constituted by the measuring part 201, the moving mechanism 202, the exciting coil 203, the phase detection circuit 204 and the rest.

The exciting coil 203 allows the modulated current to flow, in order to generate the magnetic field up to inside of the object 902 such as the structure. Therefore, the eddy current occurs in metal inside the object 902, and for example, in the case where a crack occurs in a metal plate inside the structure, symmetry property of the magnetic field is broken and change of the magnetic field which the eddy current forms far from it, appears (so-called eddy current testing).

In the nondestructive inspection apparatus 1c, measurement is performed by the measuring part 201 in synchronization with the driving period of the exciting coil 203 (i.e., at the same period as the coil), the first image and the second image are obtained in the same way as FIGS. 5 and 16 and the rest, and therefore, the three-dimensional field caused in the inside of the object 902 by the forced field of the magnetic potential from outside, is calculated. With the above operation, it is achieved to accurately inspect a structure and a defect of metal inside the object 902 (such as an atomic reactor and a bridge support) nondestructively. In addition, detection of the magnetic field may be performed by two-dimensionally scanning the SQUIDs or two-dimensionally scanning the magnet (it includes the MFM). The exciting coil 203 is not limited to one coil, but it may be a set of a plurality of coils arranged two-dimensionally.

The measurement principle of the nondestructive inspection apparatus 1c can be used for resource exploration by enlarging the scale of the measurement target. For example, a modulated magnetic field is formed by the enormous coil which is a square of 100 m side, the SQUIDs or the magnet is scanned at positions of different heights (it includes the MFM), and the first image and the intermediate image described above are obtained. Then, the three-dimensional field is reconfigured from the first image and the second image in the same way as FIG. 5, and it is performed to identify a depth and a position of the underground resource from the breakage of the magnetic field.

The method of obtaining the three-dimensional field with exerting the magnetic field from outside may be used for measurement of Nuclear Magnetic Resonance or Nuclear Quadrupole Resonance using the SQUID, and therefore, high accuracy three-dimensional measurement is achieved. The field which is forcedly exerted from outside and which varies periodically, is not limited to the magnetic field, but it may be another type of field such as electric field, temperature, gravity field. Also, it may be the photoelectric field observed by the scanning near field optical microscopy Though discussion which targets the three-dimensional field satisfying the Laplace equation which is time-invariant, has made in the above embodiment, obtaining of the field satisfying the Laplace equation can be extended to the general solution of second order partial differential equation in an n-dimensional space which includes the d'Alembert equation (wave equation) having a time term. On the other hand, it can be used for the two-dimensional field. Thus, when parameters representing an n-dimensional space are shown by $x_1, x_2, x_3, \ldots, x_{n-2}, \ldots, x_{n-1}, x_n$ (where n is an integer equal to or larger than 2) and Eq.2 is generalized to Eq. 17 corresponding to a field function $\phi(x_1, x_2, \ldots, x_n)$ which shows an n-dimensional scalar field, an exact solution according to Eq.3 can be predicted and this solution is represented by Eq. 18.

$$\sum_{i=1}^{n} \frac{\partial^2 \phi}{\partial x_i^2} = 0 \qquad \text{(Eq. 17)}$$

$$\phi(x_1, x_2, \ldots, x_n) = \int \int \ldots \qquad \text{(Eq. 18)}$$

$$\int \exp(A) \{ a(k_{x_1}, k_{x_2}, \ldots, k_{x_{m-1}}, k_{x_{m+1}}, \ldots, k_{x_n}) \exp(-x_m \sqrt{B}) + b(k_{x_1}, k_{x_2}, \ldots, k_{x_n}) \exp(-x_m \sqrt{B}) \}$$

$$dk_{x_1} dk_{x_2} \ldots dk_{x_{m-1}} dk_{x_{m+1}} \ldots dk_{x_n}$$

where $$A = ik_{x_1} x_1 + ik_{x_2} x_2 + \ldots +$$
$$ik_{x_{m-1}} x_{m-1} + ik_{x_{m+1}} x_{m+1} + \ldots + ik_{x_n} x_n \text{ and}$$
$$B = k_{x_1}^2 + k_{x_2}^2 + \ldots + k_{x_{m-1}}^2 + k_{x_{m+1}}^2 + \ldots + k_{x_n}^2$$

Here, for example, in the case of n=4, $x_1=x$, $x_2=y$, $x_3=z$ and $x_4=ict$, Eq. 18 becomes an exact solution of the wave equation.

In Eq. 18, if the Dirichlet boundary condition and the Neumann boundary condition can be obtained about $x_m$ (where m is a positive integer equal to or less than n) by measurement, in other words, if $\phi(x_1, x_2, x_{m-1}, 0, x_{m+1}, \ldots, x_n)$ and $\phi_{xm}(x_1, x_2, \ldots, x_{m-1}, 0, x_{m+1}, \ldots, x_n)$ which is one-time differential with respect to $x_m$, (where m of $\phi_{xm}$ is a suffix of x and the same applies hereinafter) can be measured in a (n−1)-dimensional measurement space which is set outside an object and which satisfies $x_m=0$, $\phi(k_{x1}, k_{x2}, \ldots, k_{x(m-1)}, k_{x(m+1)}, \ldots, k_{xn})$ and $\phi_{xm}(k_{x1}, k_{x2}, \ldots, k_{x(m-1)}, k_{x(m+1)}, k_{xn})$ is calculated by Fourier transforming $\phi(x_1, x_2, \ldots, x_{m-1}, 0, x_{m+1}, \ldots, x_n)$ and $\phi_{xm}(x_1, x_2, \ldots, x_{m-1}, 0, x_{m+1}, \ldots, x_n)$ with respect to $x_1, x_2, \ldots, x_{m-1}, x_{m+1}, \ldots, x_n$, respectively (where $k_{x1}, k_{x2}, \ldots, k_{x(m-1)}, k_{x(m+1)}, \ldots, k_{xn}$ are wavenumbers with respect to $x_1, x_2, \ldots, x_{m-1}, x_{m+1}, \ldots, x_n$) (where a character(s) following x is a suffix(es) of x and the same applies hereinafter), and furthermore, $\phi(x_1, x_2, \ldots, x_n)$ is calculated by using Eq. 19 in the same way as Eq. 11 in the case of the three-dimension.

$$\phi(x_1, \ldots, x_n) = \quad \text{(Eq. 19)}$$

$$\int\int \ldots \int \exp(A)\left\{\frac{1}{2}\left(\phi + \frac{\phi_{x_m}}{\sqrt{B}}\right)\exp(x_m\sqrt{B}) + \frac{1}{2}\left(\phi - \frac{\phi_{x_m}}{\sqrt{B}}\right)\exp(-x_m\sqrt{B})\right\}dk_{x_1}$$

$$dk_{x_2} \ldots dk_{x_{m-1}}dk_{x_{m+1}} \ldots dk_{x_n} \text{ where}$$

$\phi$ represents $\phi(k_{x_1}, k_{x_2}, \ldots, k_{x_{m-1}}, k_{x_{m+1}}, \ldots, k_{x_n})$, $\phi_{x_m}$ represents $\phi_{x_m}(k_{x_1}, k_{x_2}, \ldots, k_{x_{m-1}}, k_{x_{m+1}}, \ldots, k_{x_n})$, $A = ik_{x_1}x_1 + ik_{x_2}x_2 + \ldots +$ $\quad ik_{x_{m-1}}x_{m-1} + ik_{x_{m+1}}x_{m+1} + \ldots + ik_{x_n}x_n$ and $B = k_{x_1}^2 + k_{x_2}^2 + \ldots + k_{x_{m-1}}^2 + k_{x_{m+1}}^2 + \ldots + k_{x_n}^2$ As described above, $\phi(x_1, x_2, \ldots, x_{m-1}, 0, x_{m+1}, \ldots, x_n)$ and $\phi_{x_m}(x_1, x_2, \ldots, x_{m-1}, 0, x_{m+1}, \ldots, x_n)$ are obtained in the measured value group obtaining part, the above calculation is performed in the operation part, and therefore, an n-dimensional field obtaining apparatus can be substantialized.

The above calculation principle can be applied to the case where the number of times of differential is arbitrary, in a similar fashion to the case of Eq. 12. If $\phi_{xm}^{(q)}(x_1, x_2, \ldots, x_{m-1}, 0, x_{m+1}, \ldots, x_n)$ and $\phi_{xm}^{(p)}(x_1, x_2, \ldots, x_{m-1}, 0, x_{m+1}, \ldots, x_n)$ which are q times differential and p times differential of $\phi(x_1, x_2, \ldots, x_n)$ with respect to $x_m$ in the measurement space (where p, q are integers which are equal to or larger than 0, and one of them is odd and the other is even), can be obtained in the measured value group obtaining part of the n-dimensional field obtaining apparatus, $\phi_{xm}^{(q)}(k_{x_1}, k_{x_2}, \ldots, k_{x(m-1)}, k_{x(m+1)}, \ldots, k_{xn})$ and $\phi_{xm}^{(p)}(k_{x_1}, k_{x_2}, \ldots, k_{x(m-1)}, k_{x(m+1)}, \ldots, k_{xn})$ is calculated by Fourier transforming $\phi_{xm}^{(q)}(x_1, x_2, \ldots, x_{m-1}, 0, x_{m+1}, \ldots, x_n)$ and $\phi_{xm}^{(p)}(x_1, x_2, \ldots, x_{m-1}, 0, x_{m+1}, \ldots, x_n)$ with respect to $x_1, x_2, \ldots, x_{m-1}, x_{m+1}, \ldots, x_n$, respectively, a Fourier transformed function of $\phi_{xm}^{(q)}(x_1, x_2, \ldots, x_n)$, which is a field formed at least at circumference or inside of the object due to existence of the object, is derived from $\phi_{xm}^{(q)}(k_{x_1}, k_{x_2}, \ldots, k_{x(m-1)}, k_{x(m+1)}, \ldots, k_{xn})$ and $\phi_{xm}^{(p)}(k_{x_1}, k_{x_2}, \ldots, k_{x(m-1)}, k_{x(m+1)}, \ldots, k_{xn})$ by Eq. 20, and the inverse Fourier transform is performed, so that $\phi_{xm}^{(q)}(x_1, x_2, \ldots, x_n)$ can be calculated by the operation part.

$$\phi_{x_m}^{(q)}(x_1, x_2, \ldots, x_n) = \int\int \ldots \int \exp(A)\sqrt{B}^{-q} \quad \text{(Eq. 20)}$$

$$\left\{\left(\frac{\phi_{x_m}^{(q)}\sqrt{B}^{-q}(-1)^p - \phi_{x_m}^{(p)}\sqrt{B}^{-p}(-1)^q}{(-1)^p - (-1)^q}\right)\exp(x_m\sqrt{B}) + \right.$$

$$\left.\left(\frac{\phi_{x_m}^{(q)}\sqrt{B}^{-q} - \phi_{x_m}^{(p)}\sqrt{B}^{-p}}{(-1)^q - (-1)^p}\right)\exp(-x_m\sqrt{B})\right\}$$

$dk_{x_1}dk_{x_2} \ldots dk_{x_{m-1}}dk_{x_{m+1}} \ldots dk_{x_n}$ where $\phi_{x_m}^{(q)}$ represents $\phi_{x_m}^{(q)}(k_{x_1}, k_{x_2}, \ldots, k_{x_{m-1}}, k_{x_{m+1}}, \ldots, k_{x_n})$, $\phi_{x_m}^{(p)}$ represents $\phi_{x_m}^{(p)}(k_{x_1}, k_{x_2}, \ldots, k_{x_{m-1}}, k_{x_{m+1}}, \ldots, k_{x_n})$, $A = ik_{x_1}x_1 + ik_{x_2}x_2 + \ldots +$ $\quad ik_{x_{m-1}}x_{m-1} + ik_{x_{m+1}}x_{m+1} + \ldots + ik_{x_n}x_n$ and $B = k_{x_1}^2 + k_{x_2}^2 + \ldots + k_{x_{m-1}}^2 + k_{x_{m+1}}^2 + \ldots + k_{x_n}^2$ In the n-dimensional field obtaining apparatus, $\phi_{xm}^{(q)}(x_1, x_2, \ldots, x_{m-1}, 0, x_{m+1}, \ldots, x_n)$ and $\phi_{xm}^{(p)}(x_1, x_2, \ldots, x_{m-1}, 0, x_{m+1}, \ldots, x_n)$ need not be obtained directly by measurement, a distribution of measured values of one type which comes from an n-dimensional scalar field or respective components of vector potential satisfying the equation of Eq. 17, is obtained as a (n−1)-dimensional first measured value group by the measured value group obtaining part, a distribution of measured values of another type which comes from the n-dimensional scalar field, is obtained as a (n−1)-dimensional second measured value group, and $\phi_{xm}^{(q)}(x_1, x_2, \ldots, x_{m-1}, 0, x_{m+1}, \ldots, x_n)$ and $\phi_{xm}^{(p)}(x_1, x_2, \ldots, x_{m-1}, 0, x_{m+1}, \ldots, x_n)$ may be calculated on the basis of these measured value groups (that is, through various arithmetical operations). The measurement space is not limited to outside of the object, but the measurement space may be set inside the object in the case where measurement can be performed inside the object.

In the case of n=4 in Eq. 20, $\phi(x, y, 0, t)$ is measured in a plane satisfying z=0, differential in the plane, i.e., $\phi_z(x, y, 0, t)$ is measured, these are Fourier transformed and substituted into an exact solution, and therefore, the four-dimensional field including the time axis can be reproduced. For practical purposes, the field such as the magnetic field is modulated from outside, signal strength and phase component are detected in the plane of z=0 by phase detection with use of two-dimensional scan of a potential sensor or a two-dimensional potential sensor array, and differential values of z in the plane are measured. This makes it possible to obtain the four-dimensional field including z components which are the depth direction. This technique can be applied to, for example, the ground penetrating radar for resource exploration, the nondestructive inspection apparatus described above, and the like.

In the case where targeted is a field of elastic undulation (wavenumber k is from 0 to infinite) which is a four-dimensional field including the time axis, for example, a substrate in water exerts periodic vibration on cells floating above the substrate, a probe of an atomic force microscopy is two-dimensionally scanned in the XY directions parallel to the substrate in the vicinity of the cells, and therefore, the Z-directional components of elastic undulation which propagates through the cells are measured to obtain the first measured value group (the Dirichlet boundary condition) which includes time as a parameter (see Step S11 of FIG. 5). Measurement is performed again after movement of the probe in the Z direction by a minute distance, to obtain the intermediate measured value group which includes time as a parameter (see Step S12). Then, in the same processes as Step S13 and later of FIG. 5, the second measured value group (the Neumann boundary condition) which is the differential measured value group, is obtained by dividing the difference between the first measured value group and the intermediate measured value group by the minute distance of the movement of the probe, the first measured value group and the second measured value group are Fourier transformed, and they are substituted into the n-dimensional field obtaining equation (where n is made to 4) shown in FIG. 20. Therefore, the four-dimensional field indicating the Z-directional components of elastic undulation is reproduced. As the result, it is achieved to obtain the structure inside the cells by measurement in outside. Such measurement is suitable for measurement for various organic or inorganic polymer. The above measurement principle of the elastic wavefield can be applied to an enormous object, for example, it can be put to practical use of measurement of internal structure of a building construction.

Measurement of the elastic wavefield can be performed in an environment where medium such as liquid does not exist around the probe of the atomic force microscopy. For example, an object is vibrated periodically, the probe of the atomic force microscopy is two-dimensionally scanned with it close to the object, and therefore, the first measured value group which is displacement of (a group of) atom(s) or molecule(s) equal to or more than one with respect to the Z direction in respective positions on the surface of the object, is obtained on the basis of displacement of the probe, i.e., atomic force or intermolecular force. On the other hand, since the atomic/intermolecular force includes displacement information of atoms or molecules at the surface and differential of the atomic/intermolecular force corresponds to differential of amounts of displacement in the Z direction which is a space coordinate axis, the second measured value group which is differential of amounts of displacement of the surface, can be obtained by measuring change of resonance frequency of the probe. Then, the first measured value group and the second measured value group are Fourier transformed and they are substituted into the n-dimensional field obtaining equation (where n is made to 4), and therefore, it is achieved to reproduce the elastic wavefield inside the object.

Though the preferred embodiments of the present invention have been discussed above, the present invention is not limited to the above-discussed preferred embodiments, but allows various variations.

For example, in the MFM 1 in accordance with the first preferred embodiment, measurement is performed twice at two measurement planes 91 and 92 (see FIG. 6), however, the head part 2 is provided with two cantilevers 22 and probes 21 whose positions differ in the height direction, and the magnetic force image (the first image) and the auxiliary magnetic force image (the intermediate image) may be obtained by one-time two-dimensional scan. In the case where the SQUIDs are used for measurement, the first image and the intermediate image can be obtained simultaneously in the same way. A various technique other than the above can be used as measurement technique, for example, a head part where carbon nanotube or a magnetic particle(s) is employed as the cantilever, may be used. Even if affection of both the magnetic force and the electric force is measured in measurement, these fields are reproduced simultaneously since these satisfy the Laplace equation concurrently. In other words, the field to be measured may be the field where a plurality of types of fields are mixed.

Relative movement of the head part 2 to the sample 9 is not limited to the manner shown in the above preferred embodiments, but for example, the sample table 31 may be moved in the X, Y and Z direction with use of piezoelectric devices. The moving mechanism with respect to the X, Y and Z direction, may be one unit having a plurality of piezoelectric devices, and also, be one having individual piezoelectric devices for respective directions.

The three-dimensional field obtaining method described above can be used for a various scanning probe microscopy, and the electric force microscopy, the above-discussed atomic force microscopy and so on can be quoted as a example other than the MFM. In addition, it can be applied to so-called the SQUID microscopy where a head in which permalloy with high magnetic permeability is made to needle-like shape and it is led at the center of the SQUID, is provided and the magnetic field in the surface of the object is detected by the SQUID through the permalloy with high resolution. In this case, by performing acquisition (i.e., reproduction) of the three-dimensional field, measurement with high spatial resolution can be performed even in the state that the head is lifted (the head is away) from the surface of the object, and it is achieved to perform measurement by simple control without misgivings about damage of the needle.

In the above-discussed preferred embodiments, since the three-dimensional magnetic field or electric field can be measured, a spatial site (a portion of space) which absorbs the externally-applied electromagnetic field due to Zeeman splitting or Stark effect can be identified. For example, the sample is revolved, or revolving of the externally-applied magnetic field vector or application of the magnetic field is set so that it becomes a spatially monotonic magnetic field distribution, and it is therefore possible to apply it to an MRI apparatus for the local. The above operation may be performed in combination.

In the above-discussed preferred embodiments, the field defined by coordinates in the three-dimensional space is shown as the three-dimensional field and the field in which time is added to the three-dimensional space coordinates is exemplified as the four-dimensional field, however, the n-dimensional field obtaining equation shown in Eq. 20 can be used in a system having a various type of parameter (variable) which approximately or exactly satisfies the equation derived by extending the Laplace equation shown in Eq. 17 to the n-dimension. For example, in measurement of a certain physical quantity, if n parameters representing the measurement environment such as temperature, time, processing speed, capacity of process chamber, exist and a region approximately satisfying Eq.17 exists in the case where measured values are regarded as the field of n-dimension, the n-dimensional field can be reproduced with use of the n-dimensional field obtaining equation by performing measurement of (n−1)-dimension twice.

In obtaining of the n-dimensional field (including the three-dimensional field), anything derived by multiplying an actual parameter by a coefficient may be treated as a parameter of calculation. In other words, in the case where the equation derived by multiplying each term of Eq. 17 by the coefficient is satisfied, the equation can be led to the form of Eq. 17 forcedly by performing conversion which brings the coefficient into the parameter.

The three-dimensional field and the n-dimensional field need not be obtained strictly according to the above-discussed three-dimensional field obtaining equation or n-dimensional field obtaining equation, and they may be properly calculated by an operation similar or approximate to it, or an operation transformed from it. The well-known various skillful techniques may be employed with regards to the Fourier transform and the inverse Fourier transform.

While the invention has been shown and described in detail, the foregoing description is in all aspects illustrative and not restrictive. It is therefore understood that numerous modifications and variations can be devised without departing from the scope of the invention.

The invention claimed is:

1. A three-dimensional field obtaining apparatus for obtaining φ(x, y, z), wherein x, y, z show coordinate parameters in a rectangular coordinate system defined by X, Y, Z directions which are orthogonal to one another, or obtaining a function derived by differentiating φ(x, y, z) with respect to z one time or more, φ(x, y, z) being a field function showing a three-dimensional scalar field which is formed at least at a circumference or inside of an object due to the existence of said object and satisfies the Laplace equation, said three-dimensional field obtaining apparatus comprising:
 a measured value group obtaining part for obtaining a distribution of measured values of one type in a measurement plane as a two-dimensional first measured value group and obtaining a distribution of measured values of another type in said measurement plane as a two-dimensional second measured value group, said measurement plane being set outside or inside an object and satisfying z=0, said distribution of measured values of one type coming from said three-dimensional scalar field, said distribution of measured values of another type coming from said three-dimensional scalar field; and
 an operation part for obtaining $\phi_z^{(q)}(x, y, 0)$ and $\phi_z^{(p)}(x, y, 0)$ which are q times differential and p times differential of φ(x, y, z) in said measurement plane with respect to z, wherein p, q are integers which are equal to or larger than 0 and wherein one of the integers p and q is odd and the other is even, on the basis of said first measured value group and said second measured value group, and calculating $\phi_z^{(q)}(k_x, k_y)$ and $\phi_z^{(p)}(k_x, k_y)$ by Fourier transforming $\phi_z^{(q)}(x, y, 0)$ and $\phi_z^{(p)}(x, y, 0)$, respectively, wherein $k_x$, $k_y$ are wavenumbers in the X direction and the Y direction, and furthermore calculating $\phi_z^{(q)}(x, y, z)$ by deriving a Fourier transformed function of $\phi_z^{(q)}(x, y, z)$ from $\phi_z^{(q)}(k_x, k_y)$ and $\phi_z^{(p)}(k_x, k_y)$.

2. The three-dimensional field obtaining apparatus according to claim 1, wherein said operation part calculates $\phi_z^{(q)}(x, y, z)$ by $$\phi_z^{(q)}(x, y, z) = \int\int \exp(ik_x x + ik_y y)\sqrt{k_x^2 + k_y^2}^{\,q}$$

$$\left\{ \left( \frac{\phi_z^{(q)}(k_x,k_y)\sqrt{k_x^2+k_y^2}^{-q}(-1)^p - \phi_z^{(p)}(k_x,k_y)\sqrt{k_x^2+k_y^2}^{-p}(-1)^q}{(-1)^p - (-1)^q} \right) \exp\!\left(z\sqrt{k_x^2+k_y^2}\right) + \left( \frac{\phi_z^{(q)}(k_x,k_y)\sqrt{k_x^2+k_y^2}^{-q} - \phi_z^{(p)}(k_x,k_y)\sqrt{k_x^2+k_y^2}^{-p}}{(-1)^q - (-1)^p} \right) \exp\!\left(-z\sqrt{k_x^2+k_y^2}\right) \right\} dk_x dk_y.$$

3. The three-dimensional field obtaining apparatus according to claim 1, wherein
 p is (q+1), said first measured value group shows $\phi_z^{(q)}(x, y, 0)$, and
 said measured value group obtaining part comprises:
 a measuring part for obtaining said distribution of measured values of one type as a two-dimensional measured value group, said distribution of measured values of one type coming from said three-dimensional scalar field; and
 a differential measured value group generating part for calculating a difference measured value group between said first measured value group obtained in said measurement plane by said measuring part and an intermediate measured value group obtained by said measuring part in a plane away from said measurement plane by a distance with respect to the Z direction, to obtain a differential measured value group as said second measured value group, said differential measured value group being derived by dividing said difference measured value group by said distance.

4. The three-dimensional field obtaining apparatus according to claim 1, wherein said three-dimensional scalar field is a field of magnetic, electric, temperature or gravity potential.

5. The three-dimensional field obtaining apparatus according to claim 4, wherein q is 0 or 1.

6. The three-dimensional field obtaining apparatus according to claim 1, wherein said operating part substitutes a value which indicates a position of a surface of said object or a position adjacent to said surface, into z of $\phi_z^{(q)}(x, y, z)$.

7. A magnetic force microscope comprising a three-dimensional field obtaining apparatus for obtaining φ(x, y, z), wherein x, y, z show coordinate parameters in a rectangular coordinate system defined by X, Y, Z directions which are orthogonal to one another, or obtaining a function derived by differentiating φ(x, y, z) with respect to z one time or more, φ(x, y, z) being a field function showing a three-dimensional scalar field of magnetic potential, said field being formed at least at a circumference or inside of an object due to the existence of said object and satisfies the Laplace equation, said three-dimensional field obtaining apparatus comprising:
 a measured value group obtaining part for obtaining a distribution of measured values of one type in a measurement plane as a two-dimensional first measured value group and obtaining a distribution of measured values of another type in said measurement plane as a two-dimensional second measured value group, said measurement plane being set outside an object and satisfying z=0, said distribution of measured values of one type coming from said three-dimensional scalar field, said distribution of measured values of another type coming from said three-dimensional scalar field; and
 an operation part for obtaining $\phi_z^{(q)}(x, y, 0)$ and $\phi_z^{(p)}(x, y, 0)$ which are q times differential and p times differential of φ(x, y, z) in said measurement plane with respect to z, wherein p, q are integers which are equal to or larger than 0 and wherein one of the integers p and q is odd and the other is even, on the basis of said first measured value group and said second measured value group, and calculating $\phi_z^{(q)}(k_x, k_y)$ and $\phi_z^{(p)}(k_x, k_y)$ by Fourier transforming $\phi_z^{(q)}(x, y, 0)$ and $\phi_z^{(p)}(x, y, 0)$, respectively, wherein $k_x$, $k_y$ are wavenumbers in the X direction and the Y direction, and furthermore calculating $\phi_z^{(q)}(x, y, z)$ by deriving a Fourier transformed function of $\phi_z^{(q)}$ from $\phi_z^{(q)}(k_x, k_y)$ and $\phi_z^{(p)}(k_x, k_y)$, and substituting a value which indicates a position of a surface of said object or a position adjacent to said surface, into z of $\phi_z^{(q)}(x, y, z)$.

8. An information reading apparatus for reading information recorded on a surface of an object, comprising a three-dimensional field obtaining apparatus for obtaining φ(x, y, z), wherein x, y, z show coordinate parameters in a rectangular coordinate system defined by X, Y, Z directions which are orthogonal to one another, or obtaining a function derived by differentiating φ(x, y, z) with respect to z one time or more, φ(x, y, z) being a field function showing a three-dimensional scalar field which is formed at least at a circumference or inside of said object due to the existence of said object and satisfies the Laplace equation, said three-dimensional field obtaining apparatus comprising:

a measured value group obtaining part for obtaining a distribution of measured values of one type in a measurement plane as a two-dimensional first measured value group and obtaining a distribution of measured values of another type in said measurement plane as a two-dimensional second measured value group, said measurement plane being set outside an object and satisfying z=0, said distribution of measured values of one type coming from said three-dimensional scalar field, said distribution of measured values of another type coming from said three-dimensional scalar field; and an operation part for obtaining $\phi_z^{(q)}(x, y, 0)$ and $\phi_z^{(p)}(x, y, 0)$ which are q times differential and p times differential of $\phi(x, y, z)$ in said measurement plane with respect to z, wherein p, q are integers which are equal to or larger than 0 and wherein one of the integers p and q is odd and the other is even, on the basis of said first measured value group and said second measured value group, and calculating $\phi_z^{(q)}(k_x, k_y)$ and $\phi_z^{(p)}(k_x, k_y)$ by Fourier transforming $\phi_z^{(q)}(x, y, 0)$ and $\phi_z^{(p)}(x, y, 0)$, respectively, wherein $k_x$, $k_y$ are wavenumbers in the X direction and the Y direction, and furthermore calculating $\phi_z^{(q)}(x, y, z)$ by deriving a Fourier transformed function of $\phi_z^{(q)}(x, y, z)$ from $\phi_z^{(q)}(k_x, k_y)$ and $\phi_z^{(p)}(k_x, k_y)$, and substituting a value which indicates a position of a surface of said object or a position adjacent to said surface, into z of $\phi_z^{(q)}(x, y, z)$ to obtain information recorded on said surface.

9. The information reading apparatus according to claim 8, wherein said three-dimensional scalar field is a field of magnetic potential.

10. A current distribution measuring apparatus for measuring a current distribution flowing through an electric circuit of inside of an object, comprising a three-dimensional field obtaining apparatus for obtaining $\phi(x, y, z)$, wherein x, y, z show coordinate parameters in a rectangular coordinate system defined by X, Y, Z directions which are orthogonal to one another, or obtaining a function derived by differentiating $\phi(x, y, z)$ with respect to z one time or more, $\phi(x, y, z)$ being a field function showing a three-dimensional scalar field of magnetic potential, said field being formed at least at circumference or inside of said object by allowing a current to flow through said circuit and satisfies the Laplace equation, said three-dimensional field obtaining apparatus comprising:

a measured value group obtaining part for obtaining a distribution of measured values of one type in a measurement plane as a two-dimensional first measured value group and obtaining a distribution of measured values of another type in said measurement plane as a two-dimensional second measured value group, said measurement plane being set outside an object and satisfying z=0, said distribution of measured values of one type coming from said three-dimensional scalar field, said distribution of measured values of another type coming from said three-dimensional scalar field; and an operation part for obtaining $\phi_z^{(q)}(x, y, 0)$ and $\phi_z^{(p)}(x, y, 0)$ which are q times differential and p times differential of $\phi(x, y, z)$ in said measurement plane with respect to z, wherein p, q are integers which are equal to or larger than 0 and wherein one of the integers p and q is odd and the other is even, on the basis of said first measured value group and said second measured value group, and calculating $\phi_z^{(q)}(k_x, k_y)$ and $\phi_z^{(p)}(k_x, k_y)$ by Fourier transforming $\phi_z^{(q)}(x, y, 0)$ and $\phi_z^{(p)}(x, y, 0)$, respectively, wherein $k_x$, $k_y$ are wavenumbers in the X direction and the Y direction, and furthermore calculating $\phi_z^{(q)}(x, y, z)$ by deriving a Fourier transformed function of $\phi_z^{(q)}(x, y, z)$ from $\phi_z^{(q)}(k_x, k_y)$ and $\phi_z^{(p)}(k_x, k_y)$, and substituting at least one value which indicates a position of inside of said object, into z of $\phi_z^{(q)}(x, y, z)$ and calculates a current distribution of said circuit on the basis of a substitution result.

11. The current distribution measuring apparatus according to claim 10, wherein said operation part detects a defect in said circuit from said current distribution.

12. A nondestructive inspection apparatus for inspecting inside of a structure, comprising a three-dimensional field obtaining apparatus for obtaining $\phi(x, y, z)$, wherein x, y, z show coordinate parameters in a rectangular coordinate system defined by X, Y, Z directions which are orthogonal to one another, or obtaining a function derived by differentiating $\phi(x, y, z)$ with respect to z one time or more, $\phi(x, y, z)$ being a field function showing a three-dimensional scalar field of magnetic potential, said field being formed at least at circumference or inside of said object by residual stress or corrosion inside a structure and satisfies the Laplace equation, said three-dimensional field obtaining apparatus comprising:

a measured value group obtaining part for obtaining a distribution of measured values of one type in a measurement plane as a two-dimensional first measured value group and obtaining a distribution of measured values of another type in said measurement plane as a two-dimensional second measured value group, said measurement plane being set outside an object and satisfying z=0, said distribution of measured values of one type coming from said three-dimensional scalar field, said distribution of measured values of another type coming from said three-dimensional scalar field; and an operation part for obtaining $\phi_z^{(q)}(x, y, 0)$ and $\phi_z^{(p)}(x, y, 0)$ which are q times differential and p times differential of $\phi(x, y, z)$ in said measurement plane with respect to z, wherein p, q are integers which are equal to or larger than 0 and wherein one of the integers p and q is odd and the other is even, on the basis of said first measured value group and said second measured value group, and calculating $\phi_z^{(q)}(k_x, k_y)$ and $\phi_z^{(p)}(k_x, k_y)$ by Fourier transforming $\phi_z^{(q)}(x, y, 0)$ and $\phi_z^{(p)}(x, y, 0)$ respectively, wherein $k_x$, $k_y$ are wavenumbers in the X direction and the Y direction, and furthermore calculating $\phi_z^{(q)}(x, y, z)$ by deriving a Fourier transformed function of $\phi_z^{(q)}(x, y, z)$ from $\phi_z^{(q)}(k_x, k_y)$ and $\phi_z^{(p)}(k_x, k_y)$.

13. A three-dimensional field obtaining method of obtaining $\phi(x, y, z)$, wherein x, y, z show coordinate parameters in a rectangular coordinate system defined by X, Y, Z directions which are orthogonal to one another, or obtaining a function derived by differentiating $\phi(x, y, z)$ with respect to z one time or more, $\phi(x, y, z)$ being a field function showing a three-dimensional scalar field which is formed at least at a circumference or inside of an object due to the existence of said object and satisfies the Laplace equation, the three-dimensional field obtaining method comprising:

a) obtaining a distribution of measured values of one type in a measurement plane as a two-dimensional first measured value group using a measured value group obtaining part, said measurement plane being set outside or inside an object and satisfying z=0, said distribution of measured values of one type coming from said three-dimensional scalar field;

b) obtaining a distribution of measured values of another type in said measurement plane as a two-dimensional second measured value group using said measured value group obtaining said distribution of measured values of another type coming from said three-dimensional scalar field;

c) obtaining $\phi_z^{(q)}(x, y, 0)$ and $\phi_z^{(p)}(x, y, 0)$ which are q times differential and p times differential of $\phi(x, y, z)$ in said measurement plane with respect to z, wherein p, q are integers which are equal to or larger than 0 and wherein one of the integers p and q is odd and the other is even, on the basis of said first measured value group and said second measured value group;

d) calculating $\phi_z^{(q)}(k_x, k_y)$ and $\phi_z^{(p)}(k_x, k_y)$ by Fourier transforming $\phi_z^{(q)}(x, y, 0)$ and $\phi_z^{(p)}(x, y, 0)$, respectively, using a computer, wherein $k_x$, $k_y$ are wavenumbers in the X direction and the Y direction; and e) calculating $\phi_z^{(q)}(x, y, z)$ by deriving a Fourier transformed function of $\phi_z^{(q)}(x, y, z)$ from $\phi_z^{(q)}(k_x, k_y)$ and $\phi_z^{(p)}(k_x, k_y)$, using said computer.

14. The three-dimensional field obtaining method according to claim 13, wherein $\phi_z^{(q)}(x, y, z)$ is calculated in said operation e) by $$\phi_z^{(q)}(x, y, z) = \int\int \exp(ik_x x + ik_y y)\sqrt{k_x^2+k_y^2}^{\,q}$$
$$\left\{ \left( \frac{\phi_z^{(q)}(k_x,k_y)\sqrt{k_x^2+k_q^2}^{-q}(-1)^p -}{\phi_z^{(p)}(k_x,k_y)\sqrt{k_x^2+k_y^2}^{-p}(-1)^q} \right) \exp\left(z\sqrt{k_x^2+k_y^2}\right) + \left( \frac{\phi_z^{(q)}(k_x,k_y)\sqrt{k_x^2+k_y^2}^{-q} -}{\phi_z^{(p)}(k_x,k_y)\sqrt{k_x^2+k_y^2}^{-p}} \right) \exp\left(-z\sqrt{k_x^2+k_y^2}\right) \right\} dk_x dk_y.$$

15. A non-transitory recording medium carrying a three-dimensional field obtaining program for causing a computer to obtain $\phi(x, y, z)$, wherein x, y, z show coordinate parameters in a rectangular coordinate system defined by X, Y, Z directions which are orthogonal to one another, or to obtain a function derived by differentiating $\phi(x, y, z)$ with respect to z one time or more, $\phi(x, y, z)$ being a field function showing a three-dimensional scalar field which is formed at least at a circumference or inside of an object due to the existence of said object and satisfies the Laplace equation, wherein execution of said program by said computer causes said computer to perform the operations of:

a) obtaining $\phi_z^{(q)}(x, y, 0)$ and $\phi_z^{(p)}(x, y, 0)$ which are q times differential and p times differential of $\phi(x, y, z)$ in a measurement plane with respect to z, wherein p, q are integers which are equal to or larger than 0 and wherein one of the integers p and q is odd and the other is even, on the basis of a two-dimensional first measured value group and a two-dimensional second measured value group, said measurement plane being set outside or inside an object and satisfying z=0, said first measured value group being obtained in said measurement plane as a distribution of measured values of one type which comes from said three-dimensional scalar field, said second measured value group being obtained in said measurement plane as a distribution of measured values of another type which comes from said three-dimensional scalar field;

b) calculating $\phi_z^{(q)}(k_x, k_y)$ and $\phi_z^{(p)}(k_x, k_y)$ by Fourier transforming $\phi_z^{(q)}(x, y, 0)$ and $\phi_z^{(p)}(x, y, 0)$, respectively, wherein $k_x$, $k_y$ are wavenumbers in the X direction and the Y direction; and c) calculating $\phi_z^{(q)}(x, y, z)$ by deriving a Fourier transformed function of $\phi_z^{(q)}(x, y, z)$ from $\phi_z^{(q)}(k_x, k_y)$ and $\phi_z^{(p)}(k_x, k_y)$.

16. The non-transitory recording medium according to claim 15, wherein $\phi_z^{(q)}(x, y, z)$ is calculated in said operation c) by $$\phi_z^{(q)}(x, y, z) = \int\int \exp(ik_x x + ik_y y)\sqrt{k_x^2+k_y^2}^{\,q}$$
$$\left\{ \left( \frac{\phi_z^{(q)}(k_x,k_y)\sqrt{k_x^2+k_q^2}^{-q}(-1)^p -}{\phi_z^{(p)}(k_x,k_y)\sqrt{k_x^2+k_y^2}^{-p}(-1)^q} \right) \exp\left(z\sqrt{k_x^2+k_y^2}\right) + \left( \frac{\phi_z^{(q)}(k_x,k_y)\sqrt{k_x^2+k_y^2}^{-q} -}{\phi_z^{(p)}(k_x,k_y)\sqrt{k_x^2+k_y^2}^{-p}} \right) \exp\left(-z\sqrt{k_x^2+k_y^2}\right) \right\} dk_x dk_y.$$

17. An n-dimensional field obtaining apparatus for obtaining $\phi(x_1, x_2, \ldots, x_n)$, wherein n is an integer equal to or larger than 2, and $x_1, x_2, \ldots, x_n$ show parameters representing n-dimension, or obtaining a function derived by differentiating $\phi(x_1, x_2, \ldots, x_n)$ with respect to $x_m$, wherein m is a positive integer equal to or less than n, one time or more, $\phi(x_1, x_2, \ldots, x_n)$ being a field function showing an n-dimensional scalar field which is formed at least at a circumference or inside of an object due to the existence of said object and satisfies $$\sum_{i=1}^{n} \frac{\partial^2 \phi}{\partial x_i^2} = 0,$$

the n-dimensional field obtaining apparatus comprising:

a measured value group obtaining part for obtaining a distribution of measured values of one type in a (n−1)-dimensional measurement space as a (n−1)-dimensional first measured value group and obtaining a distribution of measured values of another type in said measurement space as a (n−1)-dimensional second measured value group, said measurement space being set outside or inside an object and satisfying $x_m = 0$, said distribution of measured values of one type coming from said n-dimensional scalar field, said distribution of measured values of another type coming from said n-dimensional scalar field; and an operation part for obtaining $\phi_{xm}^{(q)}(x_1, x_2, \ldots, x_{m-1}, 0, x_{m+1}, \ldots, x_n)$ and $\phi_{xm}^{(p)}(x_1, x_2, \ldots, x_{m-1}, 0, x_{m+1}, \ldots, x_n)$ which are q times differential and p times differential of $\phi(x_1, x_2, \ldots, x_n)$ in said measurement space with respect to $x_m$, wherein p, q are integers which are equal to or larger than 0 and wherein one of the integers p and q is odd and the other is even, on the basis of said first measured value group and said second measured value group, and calculating $\phi_{xm}^{(q)}(k_{x1}, k_{x2}, \ldots, k_{x(m-1)}, k_{x(m+1)}, \ldots, k_{xn})$ and $\phi_{xm}^{(p)}(k_{x1}, k_{x2}, \ldots, k_{x(m-1)}, k_{x(m+1)}, \ldots, k_{xn})$ by Fourier transforming $\phi_{xm}^{(q)}(x_1, x_2, \ldots, x_{m-1}, 0, x_{m+1}, \ldots, x_n)$ and $\phi_{xm}^{(p)}(x_1, x_2, \ldots, x_{m-1}, 0, x_{m+1}, \ldots, x_n)$, respectively, wherein $k_{x1}, k_{x2}, \ldots, k_{x(m-1)}, k_{x(m+1)}, \ldots, k_{xn}$ are wavenumbers with respect to $x_1, x_2, x_{m-1}, x_{m+1}, \ldots, x_n$, and furthermore calculating $\phi_{xm}^{(q)}(x_1, x_2, \ldots, x_n)$ by deriving a Fourier transformed function of $\phi_{xm}^{(q)}(x_1, x_2, \ldots, x_n)$ from $\phi_{xm}^{(q)}(k_{x1}, k_{x2}, \ldots, k_{x(m-1)}, k_{x(m+1)}, \ldots, k_{xn})$ and $\phi_{xm}^{(p)}(k_{x1}, k_{x2}, \ldots, k_{x(m-1)}, k_{x(m+1)}, \ldots, k_{xn})$.

18. The n-dimensional field obtaining apparatus according to claim 17, wherein said operation part calculates $\phi_{xm}^{(q)}(x_1, x_2, \ldots, x_n)$ by $$\phi_{x_m}^{(q)}(x_1, x_2, \ldots, x_n) =$$

$$\int\int \ldots \int \exp(A)\sqrt{B}^{-q}\left\{\left(\frac{\phi_{x_m}^{(q)}\sqrt{B}^{-q}(-1)^p - \phi_{x_m}^{(p)}\sqrt{B}^{-p}(-1)^q}{(-1)^p - (-1)^q}\right)\right.$$

$$\left.\exp(x_m\sqrt{B}) + \left(\frac{\phi_{x_m}^{(q)}\sqrt{B}^{-q} - \phi_{x_m}^{(p)}\sqrt{B}^{-p}}{(-1)^q - (-1)^p}\right)\exp(-x_m\sqrt{B})\right\}$$

$$dk_{x_1}dk_{x_2} \ldots dk_{x_{m-1}}dk_{x_{m+1}} \ldots dk_{x_n}$$

where $\phi_{x_m}^{(q)}$ represents $\phi_{x_m}^{(q)}(k_{x_1}, k_{x_2}, \ldots, k_{x_{m-1}}, k_{x_{m+1}}, \ldots, k_{x_n})$, $\phi_{x_m}^{(p)}$ represents $\phi_{x_m}^{(p)}(k_{x_1}, k_{x_2}, \ldots, k_{x_{m-1}}, k_{x_{m+1}}, \ldots, k_{x_n})$, $A = ik_{x_1}x_1 + ik_{x_2}x_2 + \ldots + ik_{x_{m-1}}x_{m-1} + ik_{x_{m+1}}x_{m+1} + \ldots + ik_{x_n}x_n$ and $B = k_{x_1}^2 + k_{x_2}^2 + \ldots + k_{x_{m-1}}^2 + k_{x_{m+1}}^2 + \ldots + k_{x_n}^2$.

* * * * *